(12) United States Patent
Kataoka et al.

(10) Patent No.: US 11,323,132 B2
(45) Date of Patent: May 3, 2022

(54) ENCODING METHOD AND ENCODING APPARATUS

(71) Applicant: FUJITSU LIMITED, Kawasaki (JP)

(72) Inventors: Masahiro Kataoka, Kamakura (JP); Junki Hakamata, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/915,270

(22) Filed: Mar. 8, 2018

(65) Prior Publication Data

US 2018/0294820 A1 Oct. 11, 2018

(30) Foreign Application Priority Data

Apr. 7, 2017 (JP) .............................. JP2017-077041

(51) Int. Cl.
*H03M 7/30* (2006.01)
*G06F 40/146* (2020.01)
*G06F 40/242* (2020.01)

(52) U.S. Cl.
CPC ........ *H03M 7/3088* (2013.01); *G06F 40/146* (2020.01); *G06F 40/242* (2020.01); *H03M 7/30* (2013.01); *H03M 7/3066* (2013.01); *H03M 7/6011* (2013.01); *H03M 7/707* (2013.01)

(58) Field of Classification Search
CPC .. H03M 7/3088; H03M 7/6011; H03M 7/707; G06F 17/2735
See application file for complete search history.

(56) References Cited

U.S. PATENT DOCUMENTS

| 5,455,576 | A | * | 10/1995 | Clark, II | .................. G06T 9/005 341/50 |
| 5,729,228 | A | * | 3/1998 | Franaszek | ............... G06T 9/005 341/106 |
| 5,745,881 | A | * | 4/1998 | Tada | ........................ G06F 40/53 704/7 |
| 5,809,471 | A | * | 9/1998 | Brodsky | ................ H04H 20/38 704/275 |
| 5,872,530 | A | * | 2/1999 | Domyo | ............... H03M 7/3088 341/106 |
| 6,088,699 | A | | 7/2000 | Gampper et al. | |
| 6,795,822 | B1 | * | 9/2004 | Matsumoto | ........... G06F 40/242 |

(Continued)

FOREIGN PATENT DOCUMENTS

CN 105808513 A 7/2016
EP 0788239 A2 8/1997

(Continued)

OTHER PUBLICATIONS

Extended European Search Report dated Aug. 27, 2018 for corresponding to European Patent Application No. 18161724.2, 8 pages.

(Continued)

*Primary Examiner* — Fariba Sirjani
(74) *Attorney, Agent, or Firm* — Fujitsu Patent Center

(57) ABSTRACT

An encoding apparatus includes a memory and a processor configured to acquire text data, specify a first dynamic dictionary among a plurality of dynamic dictionaries based on attribute information of a first word included in the text data, register the first word in association with a first dynamic code in the first dynamic dictionary, and encode the first word into the first dynamic code.

13 Claims, 21 Drawing Sheets

(56) References Cited

U.S. PATENT DOCUMENTS

| | | | | |
|---|---|---|---|---|
| 7,403,136 | B2* | 7/2008 | De La Cruz | H03M 7/3084 341/51 |
| 7,769,729 | B2* | 8/2010 | Faerber | H03M 7/3088 707/693 |
| 9,520,896 | B1* | 12/2016 | Kataoka | H03M 7/3088 |
| 9,793,920 | B1* | 10/2017 | Kataoka | G06F 16/31 |
| 9,798,717 | B2* | 10/2017 | Motaparti | G06F 3/0237 |
| 2003/0037077 | A1* | 2/2003 | Brill | G06F 40/232 715/257 |
| 2006/0085737 | A1* | 4/2006 | Liu | H03M 7/30 715/234 |
| 2009/0271181 | A1* | 10/2009 | Balegar | H03M 7/3084 704/10 |
| 2009/0315744 | A1* | 12/2009 | Burukhin | H03M 7/3088 341/106 |
| 2010/0030796 | A1* | 2/2010 | Netz | G06F 16/24561 707/756 |
| 2010/0161623 | A1* | 6/2010 | Torbjornsen | G06F 16/319 707/754 |
| 2011/0043387 | A1* | 2/2011 | Abali | H03M 7/3088 341/51 |
| 2012/0262314 | A1* | 10/2012 | Carlson | H03M 7/3084 341/87 |
| 2013/0181851 | A1* | 7/2013 | Kataoka | H03M 5/02 341/52 |
| 2015/0032705 | A1* | 1/2015 | Ideuchi | G06F 16/1744 707/693 |
| 2015/0280736 | A1* | 10/2015 | Ogasawara | H03M 7/3059 341/51 |
| 2016/0211863 | A1* | 7/2016 | Kataoka | G06F 40/129 |
| 2017/0017619 | A1* | 1/2017 | Kataoka | G06F 40/123 |
| 2018/0294820 | A1* | 10/2018 | Kataoka | H03M 7/6011 |
| 2019/0251062 | A1* | 8/2019 | Hakamata | G06F 16/2228 |

FOREIGN PATENT DOCUMENTS

| | | |
|---|---|---|
| EP | 0928070 | 7/1999 |
| EP | 3051429 A1 | 8/2016 |
| JP | 09-214352 | 8/1997 |
| JP | 11-284517 | 10/1999 |
| JP | 2011-530234 A | 12/2011 |
| JP | 2013-150041 | 8/2013 |
| JP | 2014-186457 | 10/2014 |
| JP | 2017-022666 | 1/2017 |

OTHER PUBLICATIONS

Ng, K. S. et al.,"Dynamic Word Based Text Compression", Proceedings of The 4th International Conference On Document Analysis and Recognition. (ICDAR). Ulm, Germany, Aug. 18, 1997, IEEE Comp. Soc, US, vol. 1, pp. 412-416, XP010244749.

European Office Action dated Sep. 16, 2020 for corresponding European Patent Application No. 18161724.2, 7 pages.

Chinese Office Action dated Aug. 3, 2021 for corresponding of Chinese Patent Application No. 201810240597.5, with English Translation, 21 pages.

European Office Action dated Jun. 17, 2021 for corresponding European Patent Application No. 18161724.2, 7 pages.

Japanese Office Action dated Apr. 6, 2021 for corresponding Japanese Patent Application No. 2017-077041, with English Translation, 9 pages.

Japanese Office Action dated Oct. 5, 2021 for corresponding Japanese Patent Application No. 2017-077041 with English Translation, 8 pages.

European Patent Office Minutes of the oral proceedings dated Jan. 18, 2022 for corresponding European Patent Application No. 18161724. 2, 8 pages.

European Patent Office decision to refuse Patent Application dated Jan. 19, 2022 for corresponding European Patent Application No. 18161724.2, 11 pages.

Chinese Office Action dated Feb. 14, 2022 for corresponding Chinese Patent Application No. 201810240597.5, with English Translation, 19 pages.

* cited by examiner

ENCODING METHOD AND ENCODING APPARATUS

CROSS-REFERENCE TO RELATED APPLICATION

This application is based upon and claims the benefit of priority of the prior Japanese Patent Application No. 2017-77041, filed on Apr. 7, 2017, the entire contents of which are incorporated herein by reference.

FIELD

The embodiments discussed herein are related to encoding techniques.

BACKGROUND

In recent years, there have been techniques in which encoding is carried out in units of word when encoding of data is carried out. In the encoding in units of word, encoding across plural words is not carried out differently from compression based on the ZIP. By carrying out the encoding in units of word, part of encoded data may be extracted while remaining encoded and be reused.

Here, in the case of carrying out the encoding in units of word, the encoding is carried out by using a static dictionary and a dynamic dictionary. The static dictionary is information in which codes are associated with words having high appearance frequency. If a word as the target of encoding does not exist in the static dictionary, the encoding is carried out by registering this word in the dynamic dictionary and allocating a dynamic code to the word. For example, the dynamic code is allocated according to the order of appearance of the word.

For example, related arts are disclosed in Japanese Laid-open Patent Publications No. 2013-150041, No. 09-214352, and No. 11-284517.

SUMMARY

According to an aspect of the embodiments, an encoding apparatus includes a memory and a processor configured to acquire text data, specify a first dynamic dictionary among a plurality of dynamic dictionaries based on attribute information of a first word included in the text data, register the first word in association with a first dynamic code in the first dynamic dictionary, and encode the first word into the first dynamic code.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Conventional technology involves a problem that it is difficult to efficiently use the dynamic dictionary.

The dynamic code allocated to a word when the dynamic dictionary is used is allocated according to the order of appearance of the word. Furthermore, when the encoding target is expanded from text to extensible markup language (XML) data or the like, a wide variety and large amount of number strings and character strings, such as numerical values, tags, and path lists, are registered in the dynamic dictionary as words in addition to words having low appearance frequency and unknown words. For this reason, when part of encoded data is extracted and reused, the whole of the dynamic dictionary is scanned and the respective types are determined. If the size of the dynamic dictionary is large, the processing time becomes long and the dynamic dictionary is not efficiently used.

Embodiment 1

Figure 1:
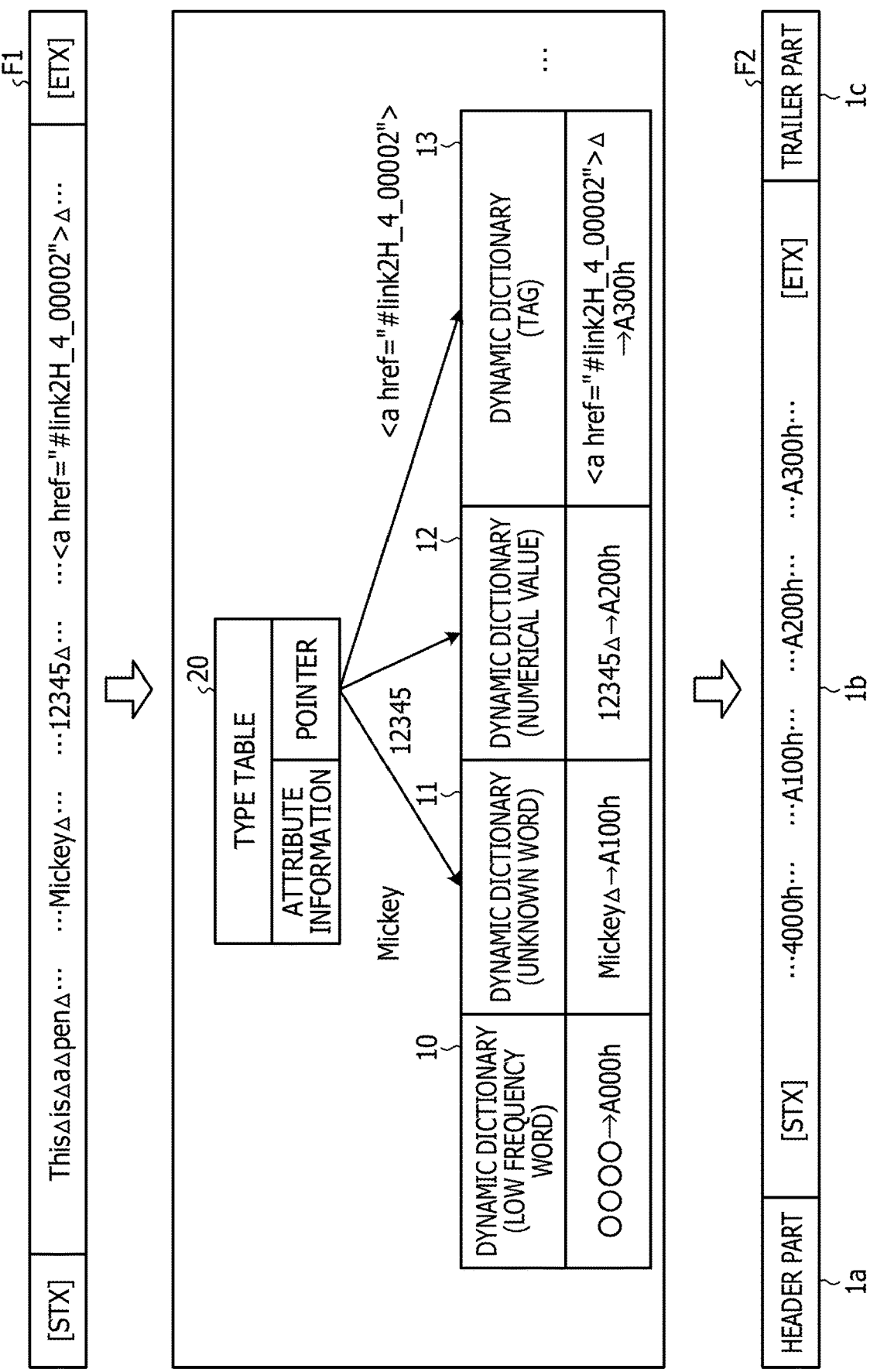
FIG. 1 is a diagram illustrating one example of encoding processing of information processing apparatus according to an embodiment 1.

FIG. 1 is a diagram illustrating one example of encoding processing of information processing apparatus according to a present embodiment 1. The information processing apparatus is one example of encoding apparatus. The information processing apparatus reads out a text file F1 of an encoding target and generates an encoded file F2 by carrying out static encoding by a static dictionary and dynamic encoding by a dynamic dictionary. The static dictionary is information in which words having high appearance frequency are associated with static codes.

The information processing apparatus reads out words from the text file F1 and executes processing of replacing words that yield a hit in the static dictionary by static codes. For example, suppose that the words included in the text file F1 are delimited by spaces. In the present embodiment, the space is represented by a white triangle as one example (in the present specification, delta symbol Δ is used as this white triangle). The content part of the text file F1 is the part sandwiched between "STX" and "ETX."

For example, suppose that words "ThisΔ," "isΔ," "aΔ," and "penΔ" included in the text file F1 are each a word that yields a hit in the static dictionary. The information processing apparatus converts the respective words "ThisΔ," "isΔ," "aΔ," and "penΔ" to static codes. In the example illustrated in FIG. 1, diagrammatic representation of the static codes corresponding to the respective words "ThisΔ," "isΔ," "aΔ," and "penΔ" is omitted.

The information processing apparatus reads out words from the text file F1. Then, regarding a word that does not yield a hit in the static dictionary, the information processing apparatus determines a dynamic dictionary corresponding to attribute information of the word from plural dynamic dictionaries and carries out dynamic encoding by using the determined dynamic dictionary. The information processing apparatus registers the word in the dynamic dictionary corresponding to the attribute information of the word and allocates a dynamic code to the word to replace the word by the dynamic code.

In the example illustrated in FIG. 1, dynamic dictionaries 10 to 13 corresponding to the respective kinds of attribute information exist. Although the dynamic dictionaries 10 to 13 are illustrated in FIG. 1, a dynamic dictionary corresponding to another kind of attribute information may exist. The dynamic dictionary 10 is a dynamic dictionary used when a "low frequency word" is subjected to dynamic encoding. For example, dynamic codes of "A000h to A0FFh" are allocated to the dynamic dictionary 10. The dynamic dictionary 11 is a dynamic dictionary used when an "unknown word" is subjected to dynamic encoding. For example, dynamic codes of "A100h to A1FFh" are allocated to the dynamic dictionary 11.

The dynamic dictionary 12 is a dynamic dictionary used when a "numerical value" is subjected to dynamic encoding. For example, dynamic codes of "A200h to A2FFh" are allocated to the dynamic dictionary 12. The dynamic dictionary 13 is a dynamic dictionary used when a "tag" is subjected to dynamic encoding. For example, dynamic codes of "A300h to A3FFh" are allocated to the dynamic dictionary 13.

One example in which the information processing apparatus determines the attribute information of a word will be described. The information processing apparatus uses an external dictionary in which low frequency words are defined, and determines the attribute information of a word as the "low frequency word" if the word yields a hit in the external dictionary. If a given tag "<, >" is included in a word, the information processing apparatus determines the attribute information of the word as the "tag." If a word is composed of numerical values of "1 to 9," the information processing apparatus determines the attribute information of the word as the "numerical value." If the attribute information of a word does not correspond to the "low frequency, word, tag, numerical value," the information processing apparatus determines the attribute information of the word as the "unknown word."

The information processing apparatus determines the dynamic dictionary corresponding to the attribute information by using a type table 20. The type table 20 associates the attribute information with a pointer. The pointer is information that indicates the dynamic dictionary corresponding to the attribute information. For example, if the attribute information is the "low frequency word," the pointer indicates the position of the dynamic dictionary 10. If the attribute information is the "unknown word," the pointer indicates the position of the dynamic dictionary 11. If the attribute information is the "numerical value," the pointer indicates the position of the dynamic dictionary 12. If the attribute information is the "tag," the pointer indicates the position of the dynamic dictionary 13.

A word "MickeyΔ" included in the text file F1 is a word that does not yield a hit in the static dictionary and the attribute information is deemed as the "unknown word." The information processing apparatus determines the dynamic dictionary 11 corresponding to the attribute information "unknown word" of the word "MickeyΔ" from the dynamic dictionaries 10 to 13. The information processing apparatus carries out dynamic encoding by allocating the dynamic code "A100h" to the word "MickeyΔ."

A word "12345Δ" included in the text file F1 is a word that does not yield a hit in the static dictionary and the attribute information is deemed as the "numerical value." The information processing apparatus determines the dynamic dictionary 12 corresponding to the attribute information "numerical value" of the word "12345Δ" from the dynamic dictionaries 10 to 13. The information processing apparatus carries out dynamic encoding by allocating the dynamic code "A200h" to the word "12345Δ."

A word "<a href="#link2H_4_00002">Δ" included in the text file F1 is a word that does not yield a hit in the static dictionary and the attribute information is deemed as the "tag." The information processing apparatus determines the dynamic dictionary 13 corresponding to the attribute information "tag" of the word "<a href="#link2H_4_00002">Δ" from the dynamic dictionaries 10 to 13. The information processing apparatus carries out dynamic encoding by allocating the dynamic code "A300h" to the word "<a href="#link2H_4_00002">Δ."

The information processing apparatus encodes the text file F1 into the encoded file F2 by executing the above-described processing. A header part 1*a*, an encoded data part 1*b*, and a trailer part 1*c* are included in the encoded file F2. Information on the appearance frequency of the word and so forth are included in the header part 1*a*. Encoded data generated by the information processing apparatus is stored in the encoded data part 1*b*. Information on the dynamic dictionaries 10 to 13 and so forth are included in the trailer part 1*c*.

The information processing apparatus according to the present embodiment 1 determines the dynamic dictionary corresponding to the attribute information of a word included in the text file F1 and carries out dynamic encoding by using the determined dynamic dictionary. This allows the dynamic dictionary in which words are associated with dynamic codes to be discriminated based on the attribute information of the word and thus the dynamic dictionary may be efficiently used.

Figure 2:
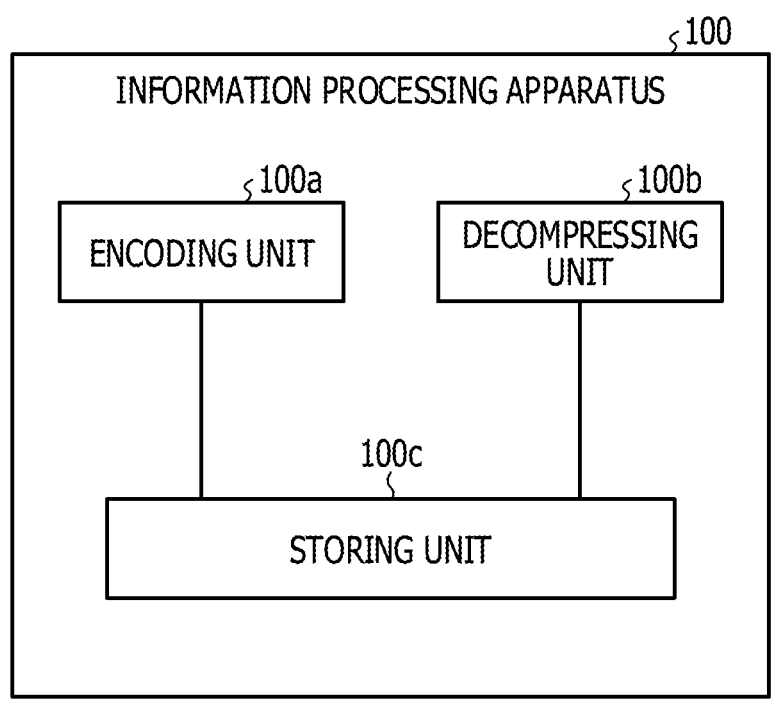
FIG. 2 is a functional block diagram illustrating a configuration of the information processing apparatus according to the embodiment 1.

FIG. 2 is a functional block diagram illustrating a configuration of the information processing apparatus according to the present embodiment 1. As illustrated in FIG. 2, this information processing apparatus 100 includes an encoding unit 100a, a decompressing unit 100b, and a storing unit 100c. The encoding unit 100a is one example of the registering unit and the encoding unit.

The encoding unit 100a is a processing unit that executes the encoding processing represented in FIG. 1. The decompressing unit 100b is a processing unit that decompresses (decodes) an encoded file encoded by the encoding unit 100a. The storing unit 100c is a storing unit that stores the text file F1 of an encoding target, the encoded file F2 obtained by encoding processing, a decompressed file F3 obtained by decompressing the encoded file F2, and so forth. The storing unit 100c corresponds to semiconductor memory elements such as random access memory (RAM), read only memory (ROM), and flash memory and storing apparatus such as a hard disk drive (HDD).

Figure 3:
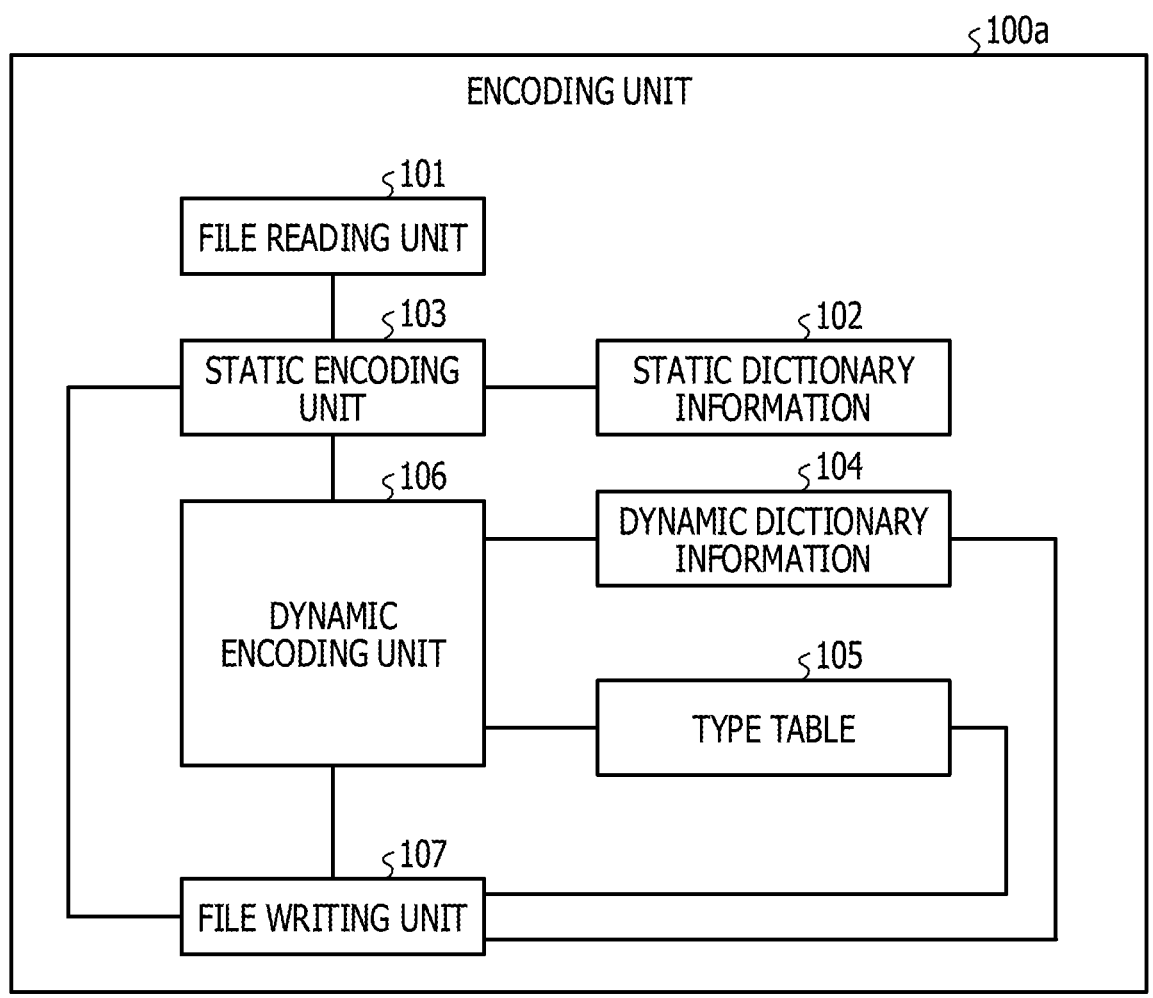
FIG. 3 is a functional block diagram illustrating one example of a configuration of an encoding unit according to the embodiment 1.

FIG. 3 is a functional block diagram illustrating one example of a configuration of an encoding unit according to the present embodiment 1. As illustrated in FIG. 3, this encoding unit 100a includes a file reading unit 101, static dictionary information 102, and a static encoding unit 103. The encoding unit 100a includes dynamic dictionary information 104, a type table 105, a dynamic encoding unit 106, and a file writing unit 107.

The file reading unit 101 is a processing unit that reads out data of the content part of the text file F1 that is stored in the storing unit 100c and becomes an encoding target. The file reading unit 101 outputs the read-out data to the static encoding unit 103.

Figure 4:
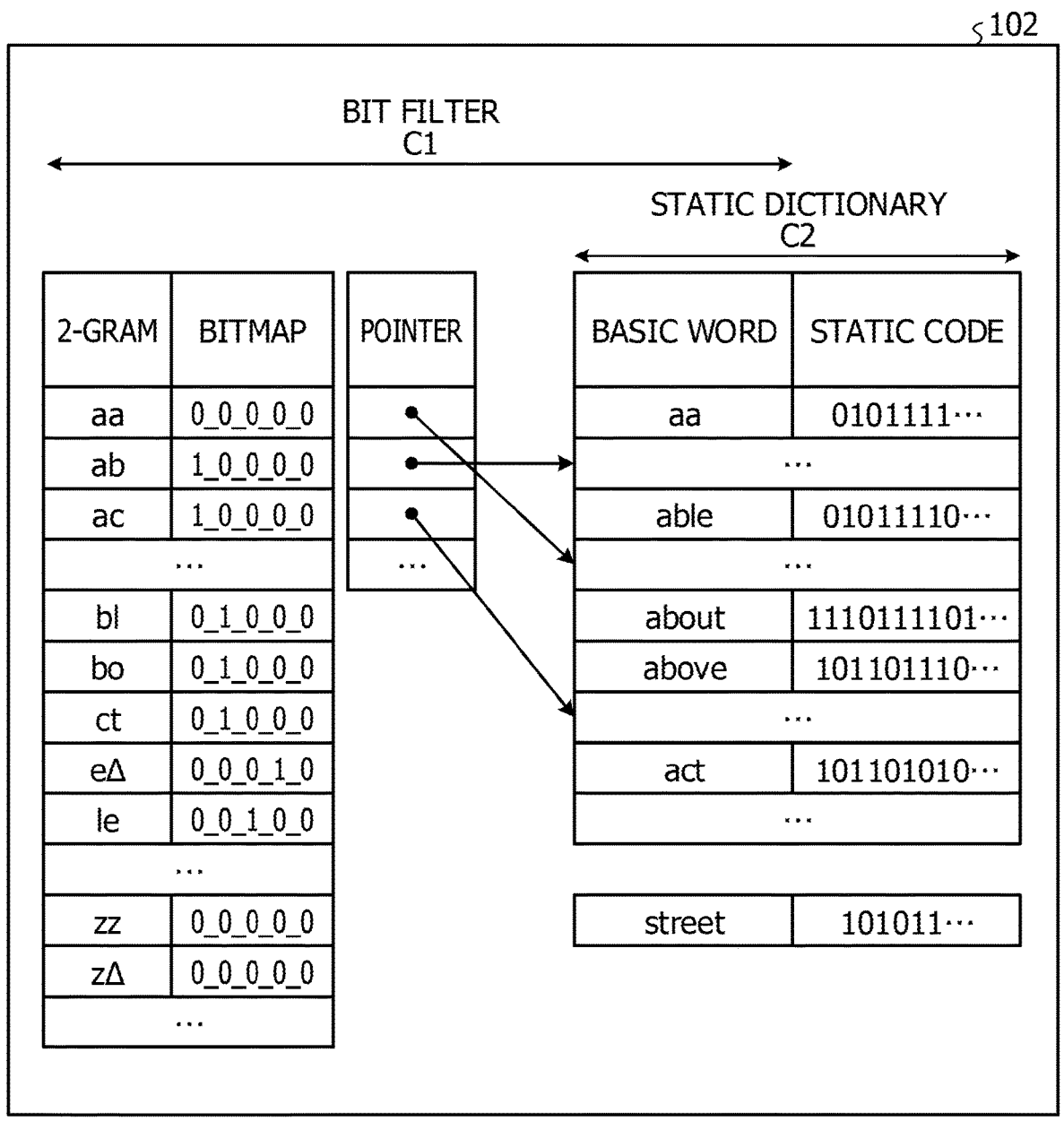
FIG. 4 is a diagram illustrating one example of a data structure of static dictionary information.

FIG. 4 is a diagram illustrating one example of a data structure of static dictionary information. The static dictionary information 102 includes information on a static dictionary C2 in which static codes for words whose appearance frequency is equal to or higher than a threshold are defined. As illustrated in FIG. 4, this static dictionary information 102 includes 2-gram, bitmap, pointer, basic word, and static code. Among these factors, the 2-gram, the bitmap, the pointer, and the basic word correspond to a bit filter C1. Furthermore, the basic word and the static code correspond to the static dictionary C2.

The 2-gram is information that represents a character string (or word) of two characters. The bitmap represents a bitmap corresponding to the character string of the 2-gram. For example, the bitmap corresponding to "aa" is "0_0_0_0_0." The pointer is a pointer that indicates the position of the basic word corresponding to the bitmap.

The basic word is words with high frequency registered in the static dictionary C2, for example. The static code is encoded data allocated to the basic word. In the static dictionary C2, information on the character string length, the appearance frequency of the word, and so forth may be included in addition to the basic word and the static code.

The static encoding unit 103 is a processing unit that compares data of content of the text file F1 of the file reading unit 101 with the bit filter C1 of the static dictionary information 102 and replaces a word that yields a hit in the bit filter C1 by a static code. The static encoding unit 103 outputs the static code corresponding to the word to the file writing unit 107.

Here, description will be made about one example of processing of the static encoding unit 103 to determine whether or not a word yields a hit in the bit filter C1. For example, if the word is "ableΔ," the static encoding unit 103 combines the bitmaps corresponding to 2-grams "ab," "bl," "le," and "eΔ" with each other. If the values of all bitmaps are 0 at a digit of the bitmaps, the static encoding unit 103 sets the corresponding digit of the bitmap obtained by the combining to "0." In contrast, the static encoding unit 103 sets the corresponding digit to "1" if "1" is included in even one bitmap. Thereby, the bitmaps are combined.

For example, suppose that the bitmap of "ab" is "1_0_0_0_0" and the bitmap of "bl" is "0_1_0_0_0" and the bitmap of "le" is "0_0_1_0_0" and the bitmap of "eΔ" is "0_0_0_1_0." In this case, the bitmap obtained by combining the respective bitmaps is "1_1_1_1_0."

The static encoding unit 103 compares the bitmap obtained by the combining with the pointer of the bit filter C1 and identifies the basic word at the position indicated by the pointer corresponding to the bitmap. The static encoding unit 103 searches for the basic word corresponding to the word from the identified basic word sequentially. If the basic word identical to the word exists, the static encoding unit 103 determines that the word yields a hit in the bit filter C1.

Figure 5:
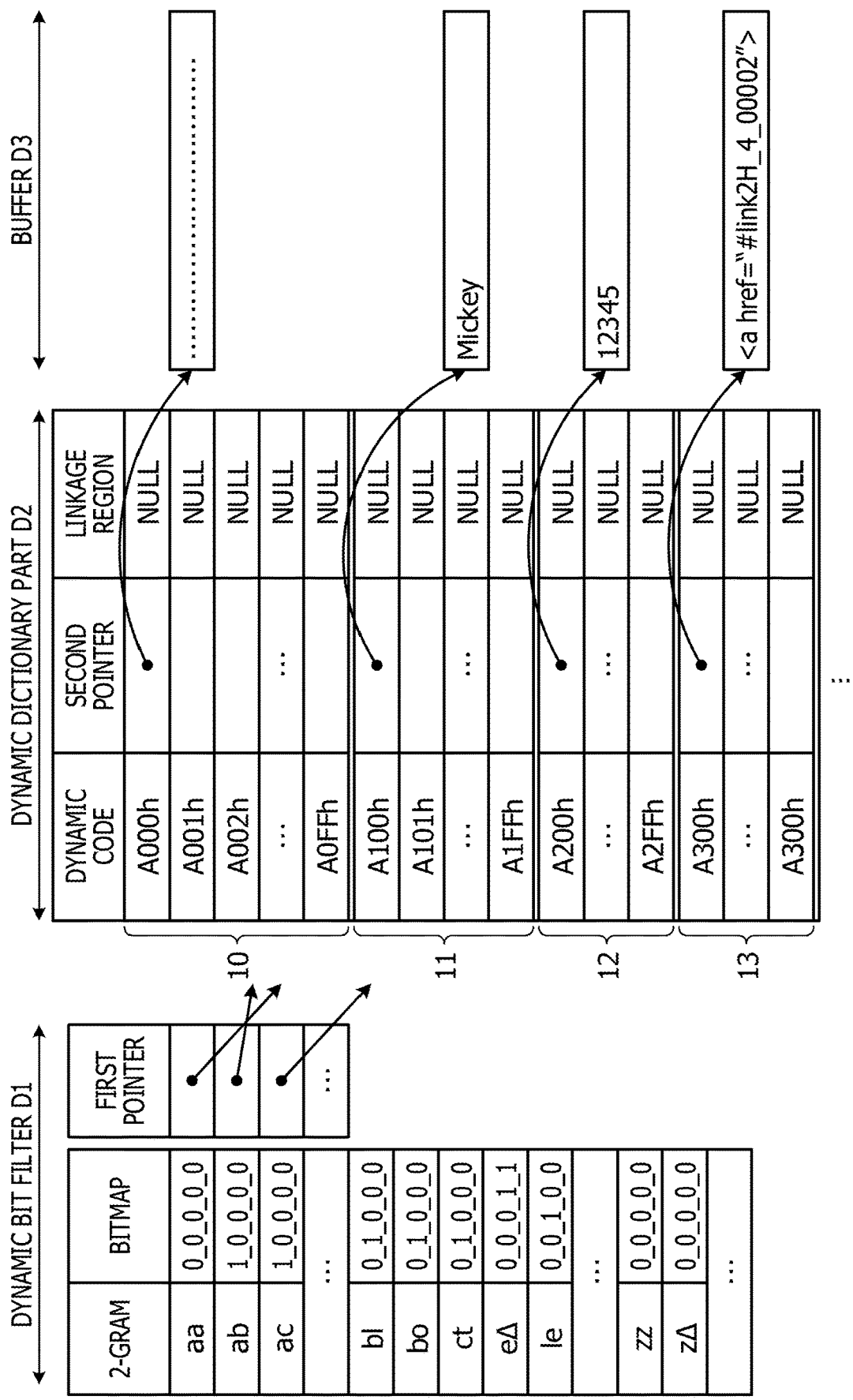
FIG. 5 is a diagram illustrating one example of a data structure of dynamic dictionary information.

FIG. 5 is a diagram illustrating one example of a data structure of dynamic dictionary information. The dynamic dictionary information 104 includes information relating to the dynamic dictionaries illustrated in FIG. 1. As illustrated in FIG. 5, this dynamic dictionary information 104 includes a dynamic bit filter D1, a dynamic dictionary part D2, and a buffer D3.

The dynamic bit filter D1 includes 2-gram, bitmap, and first pointer. The dynamic dictionary part D2 includes the dynamic dictionaries 10 to 13. The respective dynamic dictionaries 10 to 13 associate dynamic code, second pointer, and linkage region. The buffer D3 stores words before encoding with the dynamic code.

The 2-gram of the dynamic bit filter D1 is information that represents a character string of two characters (or two words). The bitmap represents a bitmap corresponding to the character string of the 2-gram. For example, the bitmap corresponding to "aa" is "0_0_0_0_0." The first pointer is a pointer that indicates the position of the dynamic code corresponding to the bitmap. Other explanations relating to the bitmap and the first pointer are like the explanations of the bitmap and the pointer represented in FIG. 4.

The dynamic code of the dynamic dictionary part D2 is codes allocated to the words stored in the buffer D3. The second pointer is information that indicates the position of the buffer D3 in which the word corresponding to the dynamic code is stored. For example, the second pointer corresponding to the dynamic code "A100h" indicates the beginning position of "Mickey" stored in the buffer D3. For example, it is meant that the word "Mickey" is dynamically encoded into the dynamic code "A100h."

The linkage region of the dynamic dictionary part D2 is information that indicates whether or not the relevant character string or the like links from a pointer of the bit filter. If the relevant character string or the like does not link, "NULL" is set in the linkage region.

Figure 6:
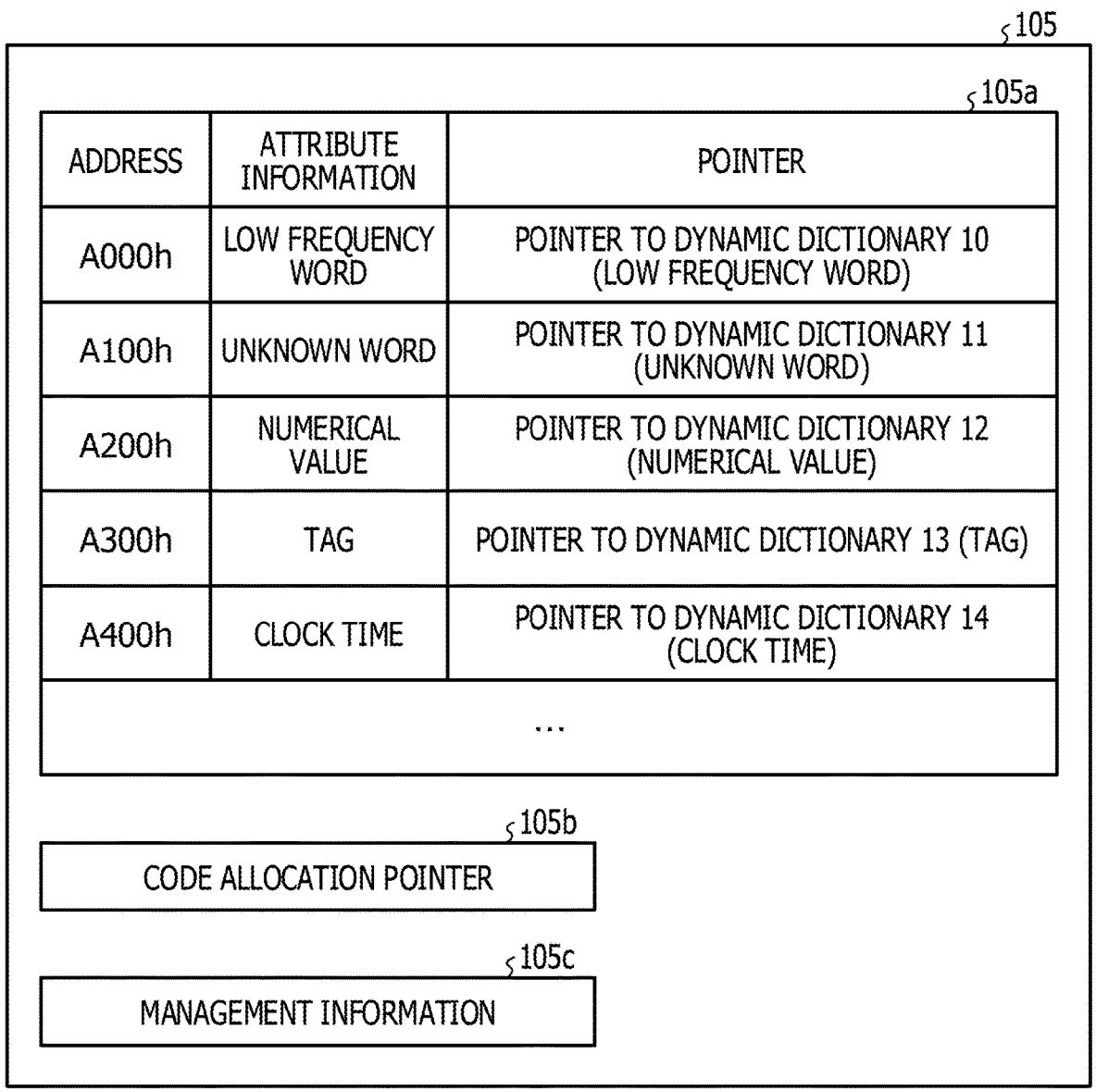
FIG. 6 is a diagram illustrating one example of a data structure of a type table.

FIG. 6 is a diagram illustrating one example of a data structure of a type table. As illustrated in FIG. 6, this type table 105 includes a table 105a, a code allocation pointer 105b, and management information 105c. The table 105a associates address, attribute information, and pointer. The address represents an address allocated to the dynamic dictionary corresponding to the relevant attribute information. The attribute information represents the above-described attribute information of the word. The pointer indicates the position of the dynamic dictionary corresponding to the attribute information.

The code allocation pointer 105b is a pointer that indicates the head of unused dynamic codes among the dynamic codes allocated to the dynamic dictionary regarding each dynamic dictionary. For example, explanation will be made regarding the dynamic dictionary 11 illustrated in FIG. 5. Suppose that dynamic codes "A100h to A1FFh" are allocated to the dynamic dictionary 11 and the dynamic code "A100h" among these codes is allocated to the dynamic code of "Mickey." In this case, the dynamic code "A101h" is set in the code allocation pointer 105b. Also regarding the other dynamic dictionaries, the pointer that indicates the head of unused dynamic codes among the dynamic codes allocated to the dynamic dictionary is set similarly.

The management information 105c is information that manages the remaining number of words to be allocated to the dynamic dictionary regarding each dynamic dictionary. Suppose that code regions are allocated to each dynamic dictionary in units of "256 areas" and words are registered in the example represented in the present embodiment 1. Furthermore, the management information 105c includes information on the pointer that indicates the position of a dynamic code that is not allocated to the dynamic dictionary (unused position).

Referring back to FIG. 3, the dynamic encoding unit 106 is a processing unit that allocates a dynamic code to a word to which a static code is not allocated by the static encoding unit 103 and carries out dynamic encoding. The dynamic encoding unit 106 outputs the dynamic code corresponding to the word to the file writing unit 107. In the following, one example of processing of the dynamic encoding unit 106 will be described.

First, description will be made about the case in which the dynamic encoding unit 106 carries out dynamic encoding of a word that is not registered in the dynamic dictionary information 104. When acquiring the word from the static encoding unit 103, the dynamic encoding unit 106 compares the attribute information of the word with the type table 105 and determines the position of the dynamic dictionary corresponding to the attribute information of the word. The dynamic encoding unit 106 allocates, to the word, the leading dynamic code that is not allocated to another word among the dynamic codes allocated to the determined dynamic dictionary. Furthermore, the dynamic encoding unit 106 stores the word in the buffer D3 and sets the second pointer to the position at which the word is stored. Moreover, the dynamic encoding unit 106 updates the first pointer of the dynamic bit filter D1 according to the position of the dynamic code corresponding to the word.

For example, description will be made about the case in which the dynamic encoding unit 106 carries out dynamic encoding of a word "Mickey" that is not registered in the dynamic dictionary information 104. The dynamic encoding unit 106 compares the attribute information "unknown word" of the word "Mickey" with the type table 105 illustrated in FIG. 6 and determines the position of the dynamic dictionary 11 corresponding to the attribute information "unknown word."

The dynamic encoding unit 106 allocates, to the word "Mickey," the leading dynamic code to which another word is not allocated among the dynamic codes "A100h to A1FFh" allocated to the dynamic dictionary 11. In the example illustrated in FIG. 5, the dynamic encoding unit 106 allocates the dynamic code "A100h" to the word "Mickey." The dynamic encoding unit 106 stores the word "Mickey" in the buffer D3 and specifies the second pointer corresponding to the dynamic code "A100h" to the position at which the word "Mickey" is stored. Furthermore, the dynamic encoding unit 106 updates the dynamic bit filter D1. The dynamic encoding unit 106 outputs the dynamic code "A100h" allocated to the word "Mickey" to the file writing unit 107.

Subsequently, description will be made about the case in which the dynamic encoding unit 106 carries out dynamic encoding of a word registered in the dynamic dictionary information 104. For example, the dynamic encoding unit 106 determines whether or not the word as the target of the dynamic encoding is registered in the dynamic dictionary information 104 by executing the following processing. The dynamic encoding unit 106 compares the word as the target of the dynamic encoding with the dynamic bit filter D1 and identifies the position of the dynamic dictionary part D2 indicated by the first pointer. The dynamic encoding unit 106 determines that the word as the target of the dynamic encoding is registered in the dynamic dictionary information 104 if the same word as the word as the target of the dynamic encoding is stored at the position of the buffer D3 indicated by the second pointer corresponding to the identified position. On the other hand, if the same word as the word as the target of the dynamic encoding is not stored, the dynamic encoding unit 106 executes the above-described processing because the word as the target of the dynamic encoding is not registered.

For example, the case in which the dynamic encoding unit 106 carries out dynamic encoding of the word "Mickey" registered in the dynamic dictionary information 104 will be described. When the dynamic encoding unit 106 compares the word "Mickey" with the dynamic bit filter D1 and refers to the position of the buffer D3 indicated by the second pointer of the dynamic code "A100h," "Mickey" is stored and the words correspond with each other. Thus, the dynamic encoding unit 106 outputs the dynamic code "A100h" allocated to "Mickey" to the file writing unit 107.

The file writing unit 107 is a processing unit that acquires static codes and dynamic codes corresponding to words and writes the acquired static codes and dynamic codes to the encoded data part 1b of the encoded file F2. Furthermore, the file writing unit 107 stores information on the appearance frequency of the word in the header part 1a. The file writing unit 107 stores the dynamic dictionary information 104 and so forth in the trailer part 1c.

Figure 7:
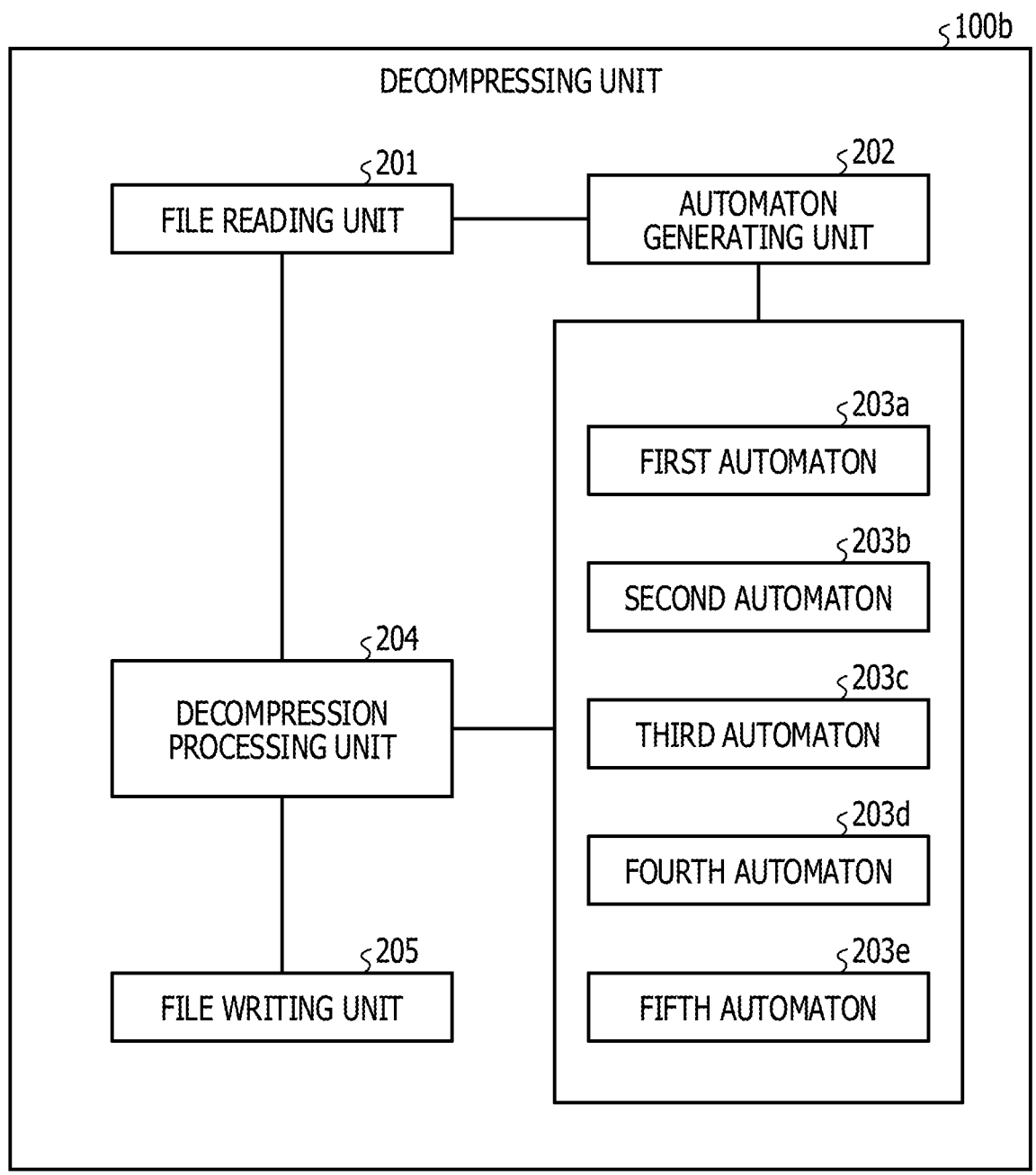
FIG. 7 is a functional block diagram illustrating one example of a configuration of a decompressing unit according to the embodiment 1.

FIG. 7 is a functional block diagram illustrating one example of a configuration of a decompressing unit according to the present embodiment 1. As illustrated in FIG. 7, this decompressing unit 100b includes a file reading unit 201, an automaton generating unit 202, a decompression processing unit 204, and a file writing unit 205. Furthermore, the decompressing unit 100b includes a first automaton 203a, a second automaton 203b, a third automaton 203c, a fourth automaton 203d, and a fifth automaton 203e, for example.

The file reading unit 201 is a processing unit that reads out codes stored in the encoded data part 1b of the encoded file F2. The file reading unit 201 outputs the read-out codes to the decompression processing unit 204. Furthermore, the file reading unit 201 reads out information on the appearance frequency of the word stored in the header part 1a and outputs the information to the automaton generating unit 202. The file reading unit 201 reads out the dynamic dictionary information 104 stored in the trailer part 1c and outputs the dynamic dictionary information 104 to the automaton generating unit 202.

The automaton generating unit 202 generates the first automaton 203a that converts a static code to a word based on the information on the appearance frequency of the word. Furthermore, the automaton generating unit 202 generates the second automaton 203*b* to the fifth automaton 203*e* that convert a dynamic code to a word based on the dynamic dictionary information 104.

The first automaton 203*a* is an automaton that associates a static code with a word (word of high frequency). For example, if the leading four bits of the code are included in "0h (0000) to 9h (1001)," the word is identified through comparison between the first automaton 203*a* and the code.

The second automaton 203*b* is an automaton that associates a dynamic code with a word (low frequency word). The second automaton 203*b* is generated corresponding to the dynamic dictionary 10 corresponding to the attribute information "low frequency word." For example, if the leading 16 bits of the code are included in "A000h to A0FFh," the word (low frequency word) is identified through comparison between the second automaton 203*b* and the code.

The third automaton 203*c* is an automaton that associates a dynamic code with a word (unknown word). The third automaton 203*c* is generated corresponding to the dynamic dictionary 11 corresponding to the attribute information "unknown word." For example, if the leading 16 bits of the code are included in "A100h to A1FFh," the word (unknown word) is identified through comparison between the third automaton 203*c* and the code.

The fourth automaton 203*d* is an automaton that associates a dynamic code with a word (numerical value). The fourth automaton 203*d* is generated corresponding to the dynamic dictionary 12 corresponding to the attribute information "numerical value." For example, if the leading 16 bits of the code are included in "A200h to A2FFh," the word (numerical value) is identified through comparison between the fourth automaton 203*d* and the code.

The fifth automaton 203*e* is an automaton that associates a dynamic code with a word (tag). The fifth automaton 203*e* is generated corresponding to the dynamic dictionary 13 corresponding to the attribute information "tag." For example, if the leading 16 bits of the code are included in "A300h to A3FFh," the word (tag) is identified through comparison between the fifth automaton 203*e* and the code.

The decompression processing unit 204 is a processing unit that identifies a word corresponding to a code based on the code acquired from the file reading unit 201 and the first automaton 203*a* to the fifth automaton 203*e*. For example, if the leading four bits of the code are included in "0h (0000) to 9h (1001)," the decompression processing unit 204 identifies the word corresponding to the code through comparison between the first automaton 203*a* and the code.

If the leading 16 bits of the code are included in "A000h to A0FFh," the decompression processing unit 204 identifies the word (low frequency word) through comparison between the second automaton 203*b* and the code.

If the leading 16 bits of the code are included in "A100h to A1FFh," the decompression processing unit 204 identifies the word (unknown word) through comparison between the third automaton 203*c* and the code.

If the leading 16 bits of the code are included in "A200h to A2FFh," the decompression processing unit 204 identifies the word (numerical value) through comparison between the fourth automaton 203*d* and the code.

If the leading 16 bits of the code are included in "A300h to A3FFh," the decompression processing unit 204 identifies the word (tag) through comparison between the fifth automaton 203*e* and the code.

The decompression processing unit 204 sequentially identifies the words corresponding to codes by repeatedly executing the above-described processing for the codes read out from the file reading unit 201 and outputs the identified words to the file writing unit 205.

The file writing unit 205 is a processing unit that stores the decoded words acquired from the decompression processing unit 204 in the decompressed file F3.

Figure 8:
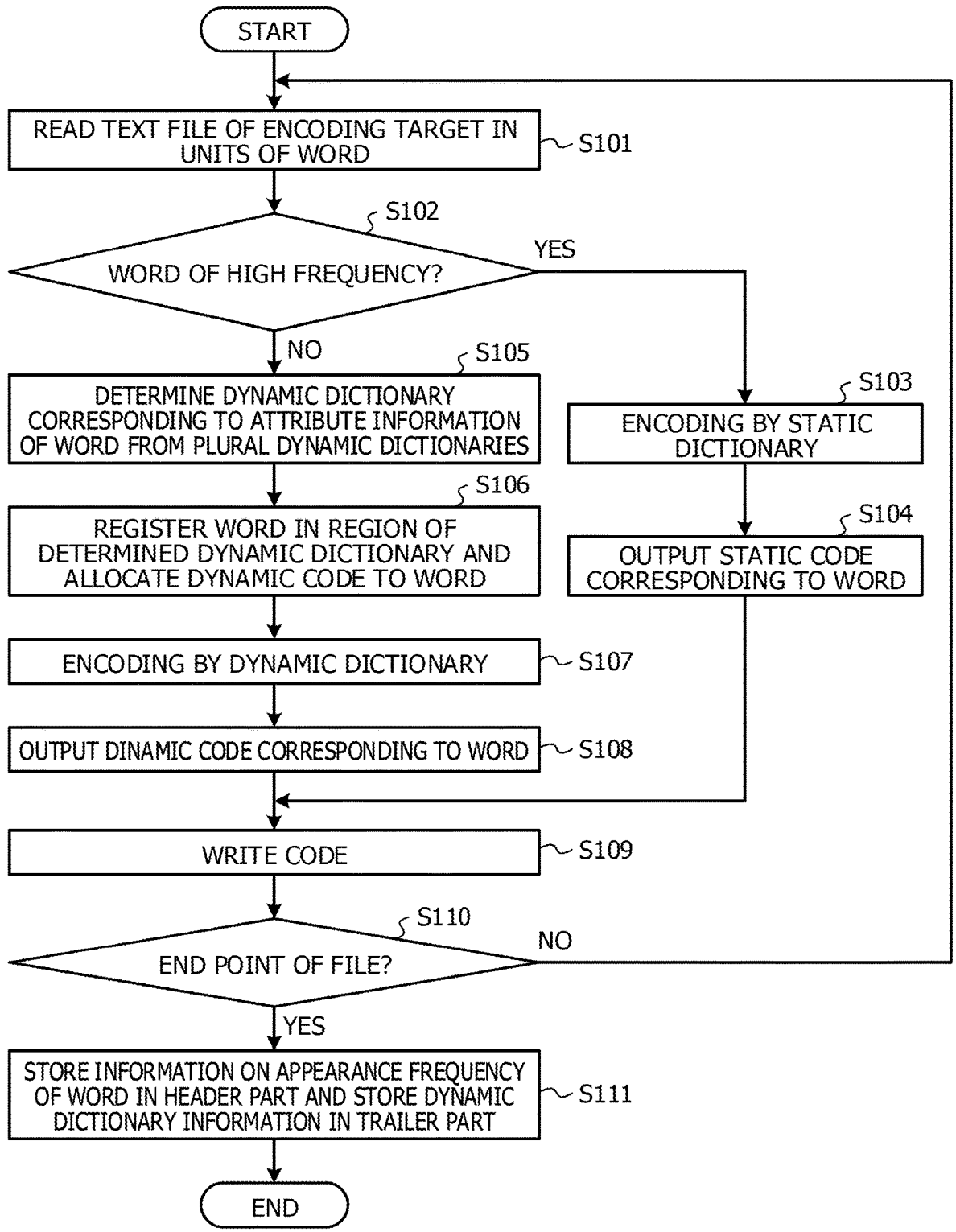
FIG. 8 is a flowchart illustrating one example of processing procedure of the encoding unit according to the embodiment 1.

Next, processing procedure of the encoding unit 100*a* according to the present embodiment 1 will be described. FIG. 8 is a flowchart illustrating a processing procedure of the encoding unit according to the present embodiment 1. As represented in FIG. 8, the file reading unit 101 of the encoding unit 100*a* reads the text file F1 of an encoding target in units of word (step S101).

The static encoding unit 103 of the encoding unit 100*a* determines whether or not the word is a word of high frequency (step S102). For example, in the step S102, the static encoding unit 103 determines that the word is a word of high frequency if the word yields a hit in the static dictionary C2.

If the word is a word of high frequency (step S102, Yes), the static encoding unit 103 carries out encoding by the static dictionary C2 (step S103). The static encoding unit 103 outputs a static code corresponding to the word to the file writing unit 107 (step S104) and makes a transition to a step S109. On the other hand, if the word is not a word of high frequency (step S102, No), the static encoding unit 103 makes a transition to a step S105.

The dynamic encoding unit 106 of the encoding unit 100*a* determines the dynamic dictionary corresponding to the attribute information of the word from plural dynamic dictionaries based on the type table 105 (step S105). The dynamic encoding unit 106 registers the word in a region of the determined dynamic dictionary and allocates a dynamic code to the word (step S106). The dynamic encoding unit 106 carries out encoding by the dynamic dictionary (step S107) and outputs the dynamic code corresponding to the word to the file writing unit 107 (step S108).

The file writing unit 107 writes the code (static code or dynamic code) to the encoded data part 1*b* of the encoded file F2 (step S109). The encoding unit 100*a* determines whether or not the end point of the text file F1 has been reached (step S110). If the end point of the text file F1 has not been reached (step S110, No), the encoding unit 100*a* makes a transition to the step S101.

If the end point of the text file F1 has been reached (step S110, Yes), the file writing unit 107 stores information on the appearance frequency of the word in the header part 1*a* of the encoded file F2 and stores the dynamic dictionary information 104 in the trailer part is (step S111).

Figure 9:
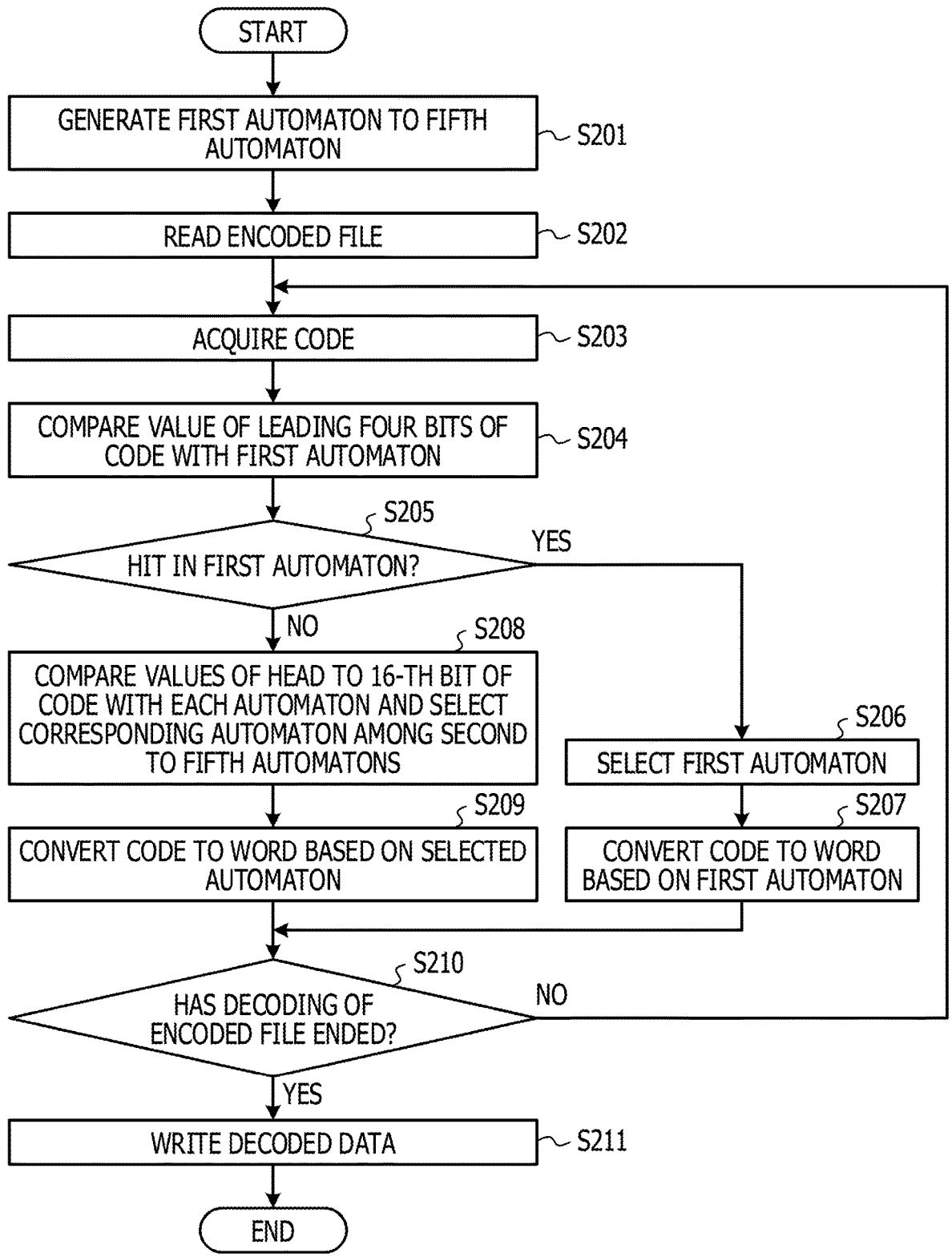
FIG. 9 is a flowchart illustrating processing procedure of the decompressing unit according to the embodiment 1.

Next, processing procedure of the decompressing unit 100*b* according to the present embodiment 1 will be described. FIG. 9 is a flowchart illustrating processing procedure of the decompressing unit according to the present embodiment 1. As represented in FIG. 9, the automaton generating unit 202 of the decompressing unit 100*b* generates the first automaton 203*a* to the fifth automaton 203*e* (step S201). The file reading unit 201 reads the encoded file F2 (step S202).

The decompression processing unit 204 of the decompressing unit 100*b* acquires a code (step S203) and compares the value of the leading four bits of the code with the first automaton 203*a* (step S204). If a hit in the first automaton 203*a* is obtained (step S205, Yes), the decompression processing unit 204 selects the first automaton 203*a* (step S206). The decompression processing unit 204 converts the code to a word (step S207) based on the first automaton 203*a* and makes a transition to a step S210.

On the other hand, if a hit in the first automaton 203a is not obtained (step S205, No), the decompression processing unit 204 makes a transition to a step S208. The decompression processing unit 204 compares the values of the head to the 16-th bit of the code with each automaton and selects the corresponding automaton among the second to fifth automatons 203b to 203e (step S208).

The decompression processing unit 204 converts the code to a word based on the selected automaton (step S209). The decompression processing unit 204 determines whether or not the decoding of the encoded file F2 has ended (step S210). If the decoding of the encoded file F2 has not ended (step S210, No), the decompression processing unit 204 makes a transition to the step S203.

If the decoding of the encoded file F2 has ended (step S210, Yes), the decompression processing unit 204 writes the decoded data to the decompressed file F3 (step S211).

Next, effects of the encoding unit 100a according to the present embodiment 1 will be described. The encoding unit 100a determines the dynamic dictionary corresponding to the attribute information of the word included in the text file F1 and carries out dynamic encoding by using the determined dynamic dictionary. This allows the dynamic dictionary in which words are associated with dynamic codes to be discriminated based on the attribute information of the word and thus the dynamic dictionary may be efficiently used. For example, based on the attribute information of the word, words corresponding to dynamic codes are registered in the respective dynamic dictionaries with discrimination. Thus, in the case of carrying out decoding, the decoding may be carried out by using the automaton corresponding to the relevant dynamic dictionary.

Embodiment 2

Figure 10:
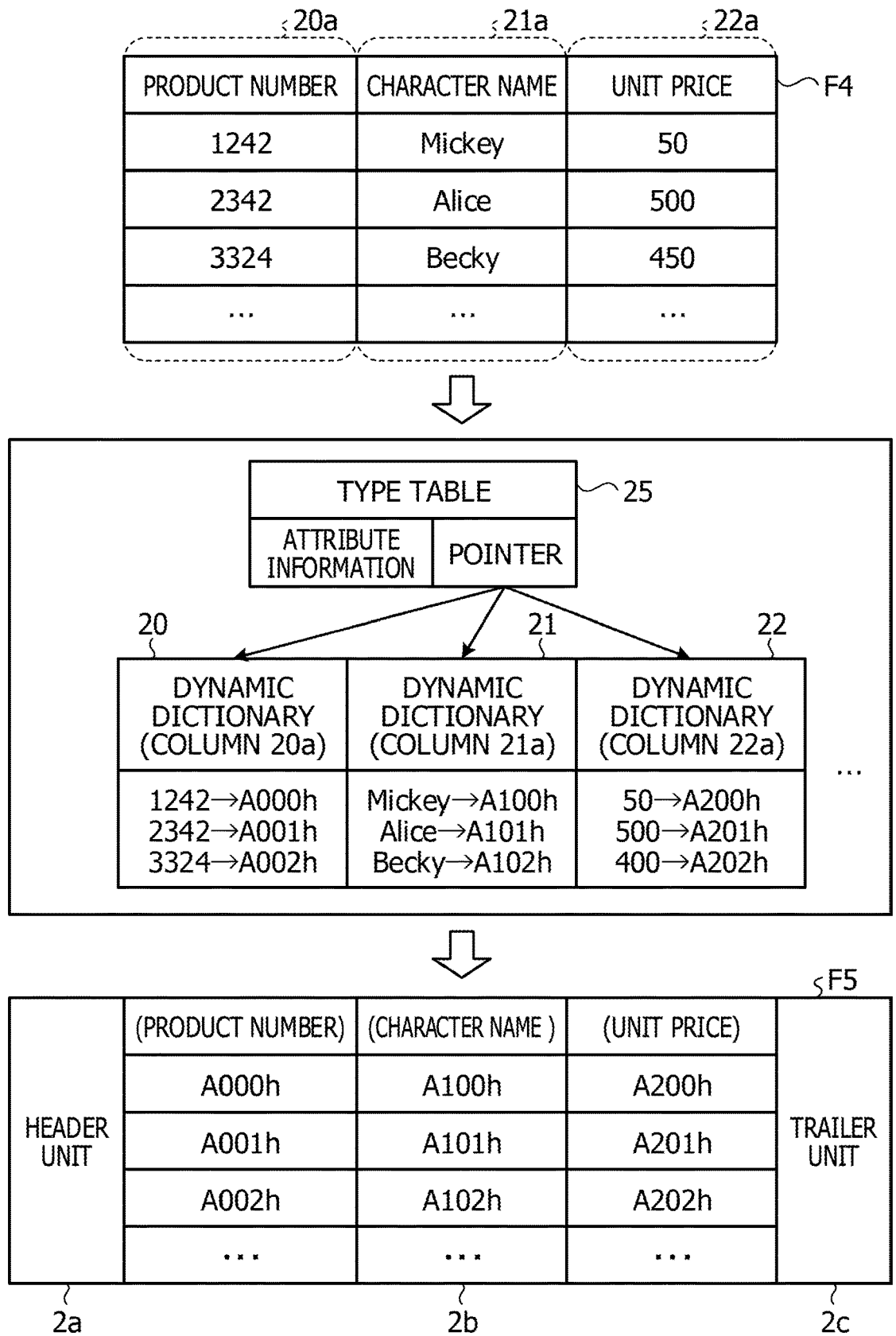
FIG. 10 is a diagram illustrating one example of encoding processing of information processing apparatus according to an embodiment 2.

FIG. 10 is a diagram illustrating one example of encoding processing of information processing apparatus according to a present embodiment 2. The information processing apparatus is one example of encoding apparatus. The information processing apparatus reads out a file F4 of an encoding target and generates an encoded file F5 by carrying out static encoding by a static dictionary and dynamic encoding by a dynamic dictionary. The static dictionary is information in which words having high appearance frequency are associated with static codes.

The file F4 explained in the present embodiment 2 is a file in which plural words are delimited into plural columns by delimiters. In the example illustrated in FIG. 10, columns 20a, 21a, and 22a are included in the file F4. Words "product number," "1242," "2342," and "3324" are included in the column 20a. Words "character name," "Mickey," "Alice," and "Becky" are included in the column 21a. Words "unit price," "50," "500," and "450" are included in the column 22a.

The information processing apparatus reads out words from the file F4 and executes processing of replacing words that yield a hit in the static dictionary by static codes. Suppose that the words included in the file F4 are delimited by spaces. Suppose that the words "product number," "character name," and "unit price" included in the file F4 are each a word that yields a hit in the static dictionary. The information processing apparatus converts each word to a static code. Here, for convenience of explanation, the static codes corresponding to the words "product number," "character name," and "unit price" are represented as "(product number)," "(character name)," and "(unit price)," respectively.

The information processing apparatus reads out words from the file F4. Then, regarding a word that does not yield a hit in the static dictionary, the information processing apparatus determines a dynamic dictionary corresponding to attribute information of the word from plural dynamic dictionaries and carries out dynamic encoding by using the determined dynamic dictionary. The information processing apparatus registers the word in the dynamic dictionary corresponding to the attribute information of the word and allocates a dynamic code to the word to replace the word by the dynamic code.

In the example illustrated in FIG. 10, dynamic dictionaries 20 to 22 corresponding to the respective kinds of attribute information exist. Although the dynamic dictionaries 20 to 22 are illustrated in FIG. 10, a dynamic dictionary corresponding to another kind of attribute information may exist. The dynamic dictionary 20 is a dynamic dictionary used when a "word of the column 20a" is subjected to dynamic encoding. For example, dynamic codes of "A000h to A0FFh" are allocated to the dynamic dictionary 20. The dynamic dictionary 21 is a dynamic dictionary used when a "word of the column 21a" is subjected to dynamic encoding. For example, dynamic codes of "A100h to A1FFh" are allocated to the dynamic dictionary 21. The dynamic dictionary 22 is a dynamic dictionary used when a "word of the column 22a" is subjected to dynamic encoding. For example, dynamic codes of "A200h to A2FFh" are allocated to the dynamic dictionary 22.

The information processing apparatus determines the dynamic dictionary corresponding to the attribute information by using a type table 25. The type table 25 associates the attribute information with a pointer. The pointer is information that indicates the dynamic dictionary corresponding to the attribute information. For example, if the attribute information is the "word of the column 20a," the pointer indicates the position of the dynamic dictionary 20. If the attribute information is the "word of the column 21a," the pointer indicates the position of the dynamic dictionary 21. If the attribute information is the "word of the column 22a," the pointer indicates the position of the dynamic dictionary 22.

Suppose that the respective words "1242," "2342," and "3324" included in the column 20a of the file F4 are words that do not yield a hit in the static dictionary. The information processing apparatus determines the dynamic dictionary 20 corresponding to the attribute information "word of the column 20a" from the dynamic dictionaries 20 to 22. The information processing apparatus carries out dynamic encoding by allocating the respective dynamic codes "A000h," "A001h," and "A002h" to the respective words "1242," "2342," and "3324," respectively.

Suppose that the respective words "Mickey," "Alice," and "Becky" included in the column 21a of the file F4 are words that do not yield a hit in the static dictionary. The information processing apparatus determines the dynamic dictionary 21 corresponding to the attribute information "word of the column 21a" from the dynamic dictionaries 20 to 22. The information processing apparatus carries out dynamic encoding by allocating the respective dynamic codes "A100h," "A101h," and "A102h" to the respective words "Mickey," "Alice," and "Becky," respectively.

Suppose that the respective words "50," "500," and "450" included in the column 22a of the file F4 are words that do not yield a hit in the static dictionary. The information processing apparatus determines the dynamic dictionary 22 corresponding to the attribute information "word of the column 22a" from the dynamic dictionaries 20 to 22. The information processing apparatus carries out dynamic encoding by allocating the respective dynamic codes "A200h," "A201h," and "A202h" to the respective words "50," "500," and "450," respectively.

The information processing apparatus encodes the file F4 into the encoded file F5 by executing the above-described processing. A header part 2a, an encoded data part 2b, and a trailer part 2c are included in the encoded file F5. Information on the appearance frequency of the word and so forth are included in the header part 2a. Encoded data generated by the information processing apparatus is stored in the encoded data part 2b. Information on the dynamic dictionaries 20 to 22 and so forth are included in the trailer part 2c.

The information processing apparatus according to the present embodiment 2 determines the dynamic dictionary corresponding to the attribute information (position of the column) of a word included in the file F4 and carries out dynamic encoding by using the determined dynamic dictionary. This allows the dynamic dictionary in which words are associated with dynamic codes to be discriminated based on the attribute information of the word and thus the dynamic dictionary may be efficiently used.

Figure 11:
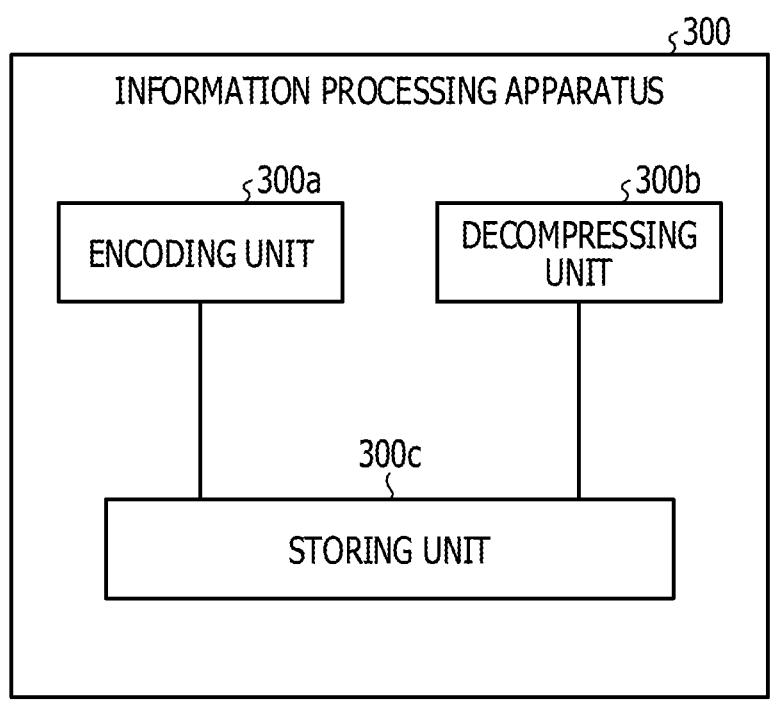
FIG. 11 is a functional block diagram illustrating a configuration of the information processing apparatus according to the embodiment 2.

FIG. 11 is a functional block diagram illustrating a configuration of the information processing apparatus according to the present embodiment 2. As illustrated in FIG. 11, this information processing apparatus 300 includes an encoding unit 300a, a decompressing unit 300b, and a storing unit 300c. The encoding unit 300a is one example of the registering unit and the encoding unit.

The encoding unit 300a is a processing unit that executes the encoding processing represented in FIG. 10. The decompressing unit 300b is a processing unit that decompresses (decodes) an encoded file encoded by the encoding unit 300a. The storing unit 300c is a storing unit that stores the file F4 of an encoding target, the encoded file F5 obtained by encoding processing, a decompressed file F6 obtained by decompressing the encoded file F5, and so forth. The storing unit 300c corresponds to semiconductor memory elements such as RAM, ROM, and flash memory and storing apparatus such as an HDD.

Figure 12:
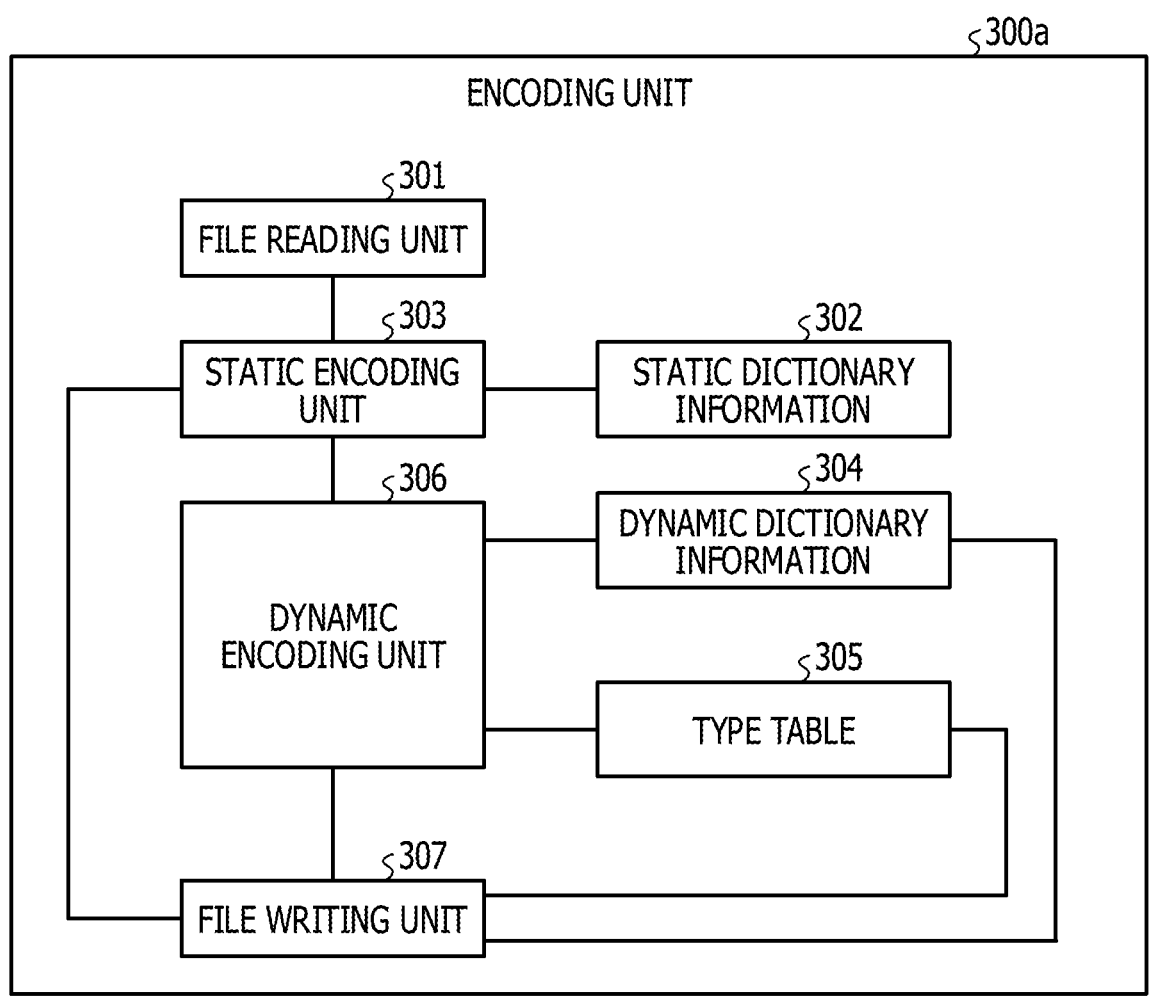
FIG. 12 is a functional block diagram illustrating one example of a configuration of an encoding unit according to the embodiment 2.

FIG. 12 is a functional block diagram illustrating one example of a configuration of an encoding unit according to the present embodiment 2. As illustrated in FIG. 12, this encoding unit 300a includes a file reading unit 301, static dictionary information 302, and a static encoding unit 303. The encoding unit 300a includes dynamic dictionary information 304, a type table 305, a dynamic encoding unit 306, and a file writing unit 307.

The file reading unit 301 is a processing unit that reads out data of the content part of the file F4 that is stored in the storing unit 300c and becomes an encoding target. The file reading unit 301 outputs the read-out data to the static encoding unit 303.

The static dictionary information 302 is information in which words having high appearance frequency are associated with static codes. Explanations relating to the static dictionary information 302 are like the explanations relating to the static dictionary information 102 explained in the present embodiment 1.

The static encoding unit 303 is a processing unit that compares data of content of the file F4 of the file reading unit 301 with the bit filter C1 of the static dictionary information 302 and replaces a word that yields a hit in the bit filter C1 by a static code. The static encoding unit 303 outputs the static code corresponding to the word to the file writing unit 307. Other explanations relating to the static encoding unit 303 are like the explanations relating to the static encoding unit 103.

Figure 13:
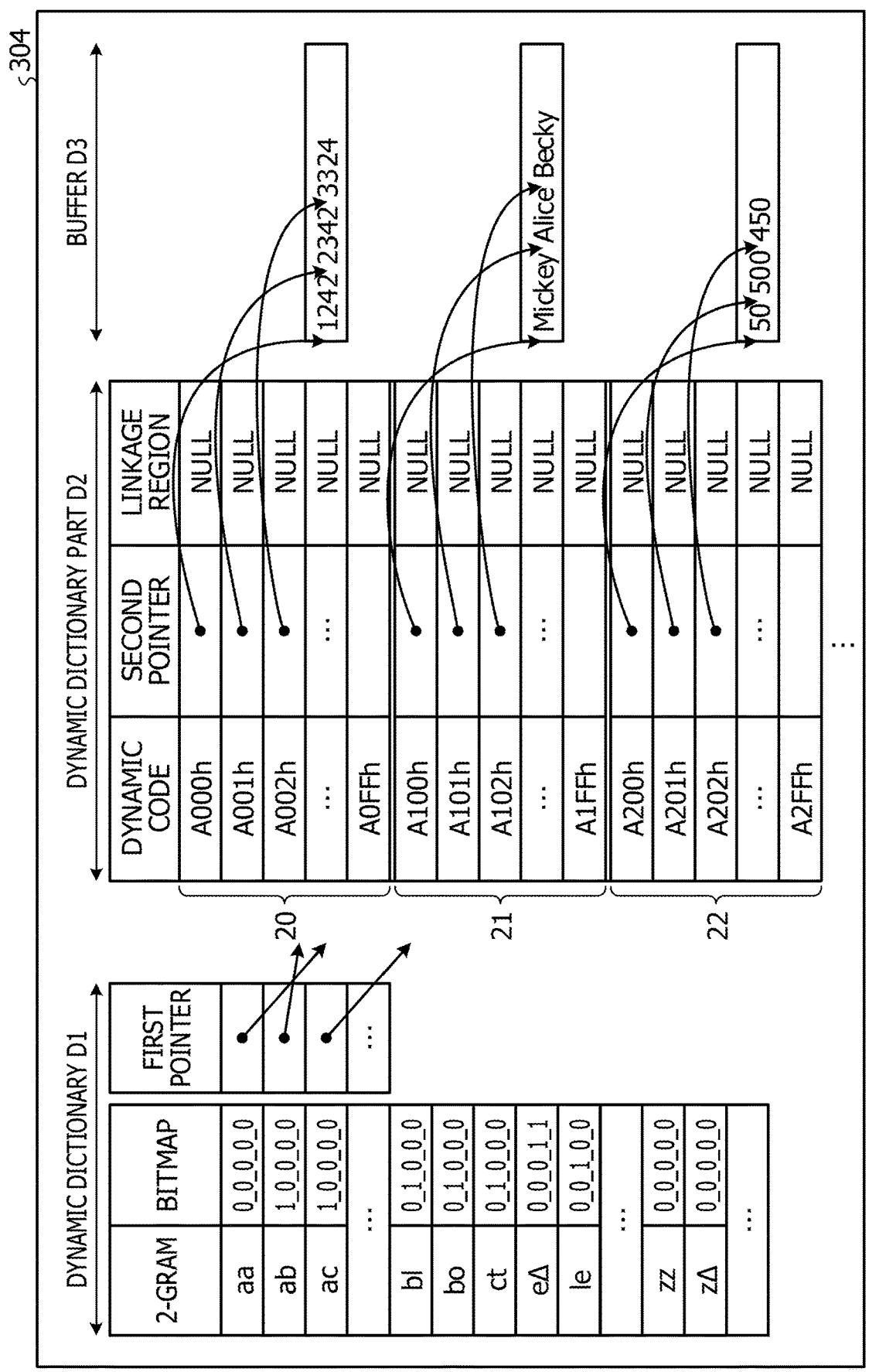
FIG. 13 is a diagram illustrating one example of a data structure of dynamic dictionary information.

FIG. 13 is a diagram illustrating one example of a data structure of dynamic dictionary information. The dynamic dictionary information 304 includes information relating to the dynamic dictionaries illustrated in FIG. 10. As illustrated in FIG. 13, this dynamic dictionary information 304 includes the dynamic bit filter D1, the dynamic dictionary part D2, and the buffer D3.

The dynamic bit filter D1 includes 2-gram, bitmap, and first pointer. The dynamic dictionary part D2 includes the dynamic dictionaries 20 to 22. The respective dynamic dictionaries 20 to 22 associate dynamic code, second pointer, and linkage region. The buffer D3 stores words before encoding with the dynamic code.

The 2-gram of the dynamic bit filter D1 is information that represents a character string of two characters (or two words). The bitmap represents a bitmap corresponding to the character string of the 2-gram. For example, the bitmap corresponding to "aa" is "0_0_0_0_0." The first pointer is a pointer that indicates the position of the dynamic code corresponding to the bitmap. Other explanations relating to the bitmap and the first pointer are like the explanations of the bitmap and the pointer represented in FIG. 4.

The dynamic code of the dynamic dictionary part D2 is codes allocated to the words stored in the buffer D3. The second pointer is information that indicates the position of the buffer D3 in which the word corresponding to the dynamic code is stored. For example, the second pointer corresponding to the dynamic code "A000h" indicates the beginning position of "1242" stored in the buffer D3. For example, it is meant that the word "1242" is dynamically encoded into the dynamic code "A000h."

The linkage region of the dynamic dictionary part D2 is information that indicates whether or not the relevant character string or the like links from a pointer of the bit filter. If the relevant character string or the like does not link, "NULL" is set in the linkage region.

Figure 14:
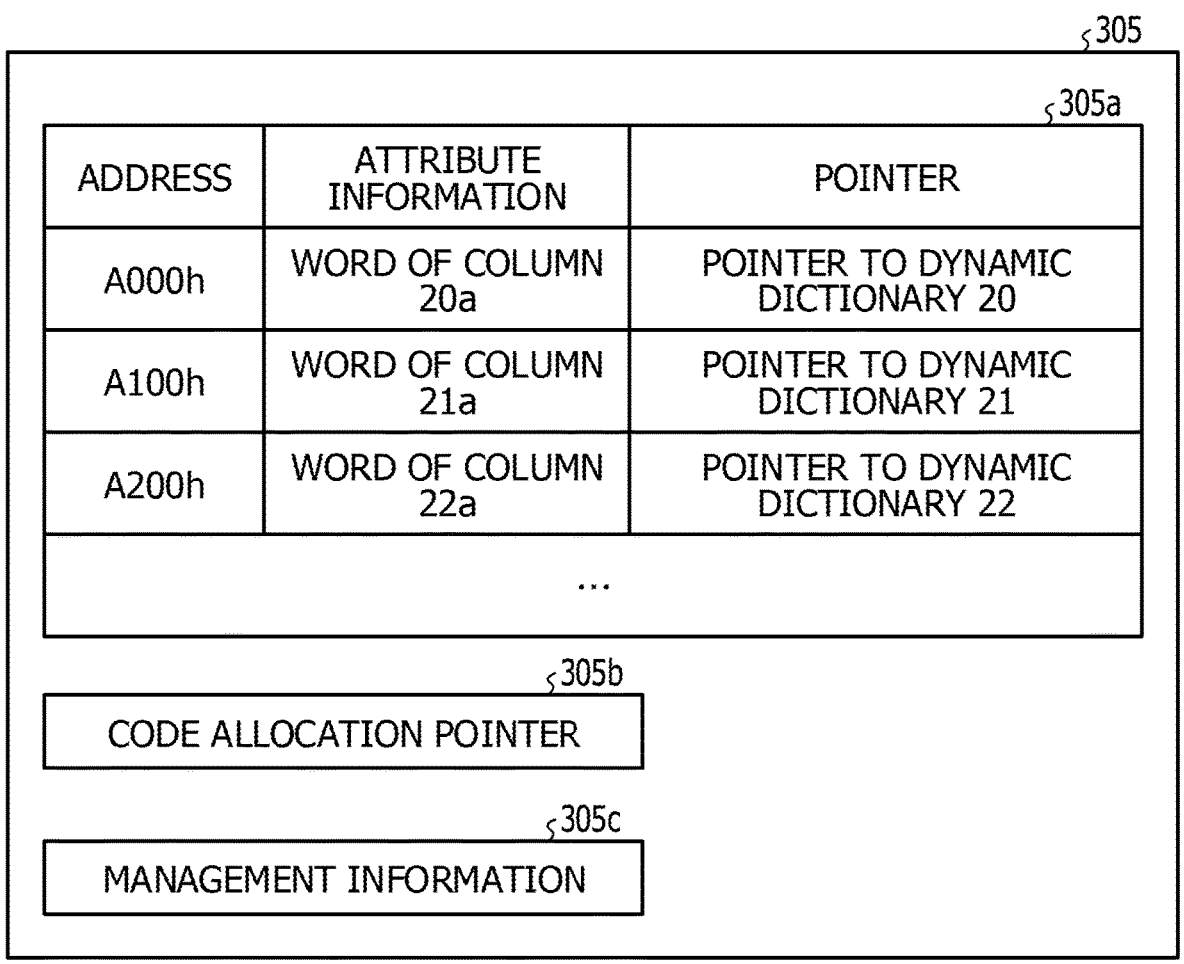
FIG. 14 is a diagram illustrating one example of a data structure of a type table.

FIG. 14 is a diagram illustrating one example of a data structure of a type table. As illustrated in FIG. 14, this type table 305 includes a table 305a, a code allocation pointer 305b, and management information 305c. The table 305a associates address, attribute information, and pointer. The address represents an address allocated to the dynamic dictionary corresponding to the relevant attribute information. The attribute information represents the above-described attribute information of the word. The pointer indicates the position of the dynamic dictionary corresponding to the attribute information.

The code allocation pointer 305b is a pointer that indicates the head of unused dynamic codes among the dynamic codes allocated to the dynamic dictionary regarding each dynamic dictionary. For example, explanation will be made regarding the dynamic dictionary 20 illustrated in FIG. 13. Suppose that dynamic codes "A000h to A0FFh" are allocated to the dynamic dictionary 20 and the dynamic codes "A000h," "A001h," and "A002h" among these codes are allocated to the dynamic codes of "1242," "2342," and "3324." In this case, the dynamic code "A003h" is set in the code allocation pointer 305b. Also regarding the other dynamic dictionaries, the pointer that indicates the head of unused dynamic codes among the dynamic codes allocated to the dynamic dictionary is set similarly.

The management information 305c is information that manages the remaining number of words to be allocated to the dynamic dictionary regarding each dynamic dictionary.

Suppose that at most "256" words are registered in each dynamic dictionary in the example represented in the present embodiment 2. Furthermore, the management information 305c includes information on the pointer that indicates the position of a dynamic code that is not allocated to the dynamic dictionary (unused position).

Referring back to FIG. 12, the dynamic encoding unit 306 is a processing unit that allocates a dynamic code to a word to which a static code is not allocated by the static encoding unit 303 and carries out dynamic encoding. The dynamic encoding unit 306 outputs the dynamic code corresponding to the word to the file writing unit 307. In the following, one example of processing of the dynamic encoding unit 306 will be described.

First, description will be made about the case in which the dynamic encoding unit 306 carries out dynamic encoding of a word that is not registered in the dynamic dictionary information 304. When acquiring the word from the static encoding unit 303, the dynamic encoding unit 306 compares the attribute information of the word with the type table 305 and determines the position of the dynamic dictionary corresponding to the attribute information of the word. The dynamic encoding unit 306 allocates, to the word, the leading dynamic code that is not allocated to another word among the dynamic codes allocated to the determined dynamic dictionary. Furthermore, the dynamic encoding unit 306 stores the word in the buffer D3 and sets the second pointer to the position at which the word is stored. Moreover, the dynamic encoding unit 306 updates the first pointer of the dynamic bit filter D1 according to the position of the dynamic code corresponding to the word.

For example, description will be made about the case in which the dynamic encoding unit 306 carries out dynamic encoding of a word "1242" that is not registered in the dynamic dictionary information 304. The dynamic encoding unit 306 compares the attribute information "word of the column 20a" of the word "1242" with the type table 305 illustrated in FIG. 14 and determines the position of the dynamic dictionary 20 corresponding to the attribute information "word of the column 20a."

The dynamic encoding unit 306 allocates, to the word "1242," the leading dynamic code to which another word is not allocated among the dynamic codes "A000h to A0FFh" allocated to the dynamic dictionary 20. In the example illustrated in FIG. 13, the dynamic encoding unit 306 allocates the dynamic code "A000h" to the word "1242." The dynamic encoding unit 306 stores the word "1242" in the buffer D3 and specifies the second pointer corresponding to the dynamic code "A000h" to the position at which the word "1242" is stored. Furthermore, the dynamic encoding unit 306 updates the dynamic bit filter D1. The dynamic encoding unit 306 outputs the dynamic code "A000h" allocated to the word "1242" to the file writing unit 307.

Subsequently, description will be made about the case in which the dynamic encoding unit 306 carries out dynamic encoding of a word registered in the dynamic dictionary information 304. For example, the dynamic encoding unit 306 determines whether or not the word as the target of the dynamic encoding is registered in the dynamic dictionary information 304 by executing the following processing. The dynamic encoding unit 306 compares the word as the target of the dynamic encoding with the dynamic bit filter D1 and identifies the position of the dynamic dictionary part D2 indicated by the first pointer. The dynamic encoding unit 306 determines that the word as the target of the dynamic encoding is registered in the dynamic dictionary information 304 if the same word as the word as the target of the dynamic encoding is stored at the position of the buffer D3 indicated by the second pointer corresponding to the identified position. On the other hand, if the same word as the word as the target of the dynamic encoding is not stored, the dynamic encoding unit 306 executes the above-described processing because the word as the target of the dynamic encoding is not registered.

For example, the case in which the dynamic encoding unit 306 carries out dynamic encoding of the word "1242" registered in the dynamic dictionary information 304 will be described. When the dynamic encoding unit 306 compares the word "1242" with the dynamic bit filter D1 and refers to the position of the buffer D3 indicated by the second pointer of the dynamic code "A000h," "1242" is stored and the words correspond with each other. Thus, the dynamic encoding unit 306 outputs the dynamic code "A000h" allocated to "1242" to the file writing unit 307.

The file writing unit 307 is a processing unit that acquires static codes and dynamic codes corresponding to words and writes the acquired static codes and dynamic codes to the encoded data part 2b of the encoded file F5. Furthermore, the file writing unit 307 stores information on the appearance frequency of the word in the header part 2a. The file writing unit 307 stores the dynamic dictionary information 304 and so forth in the trailer part 2c.

Figure 15:
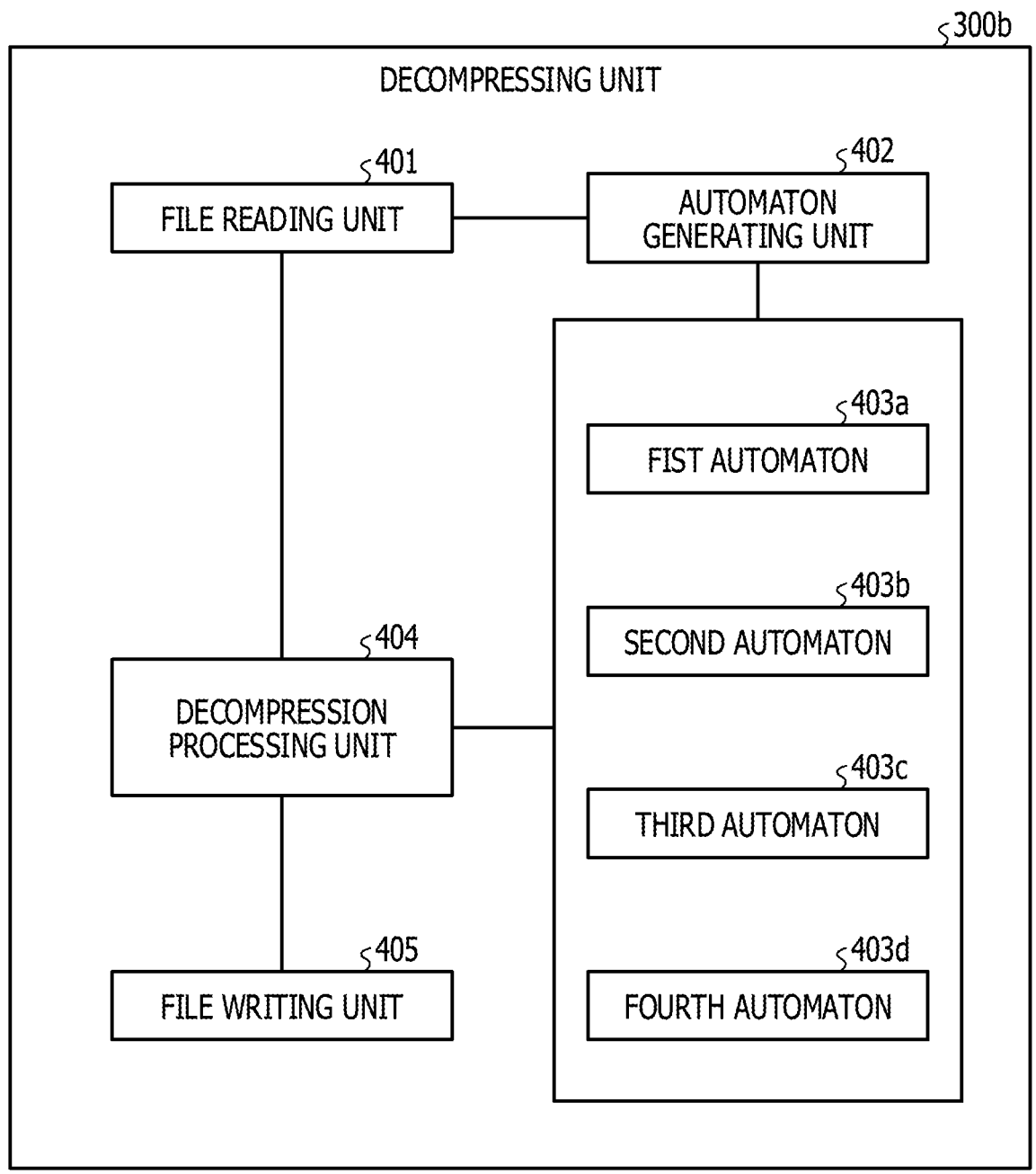
FIG. 15 is a functional block diagram illustrating one example of a configuration of a decompressing unit according to the embodiment 2.

FIG. 15 is a functional block diagram illustrating one example of a configuration of a decompressing unit according to the present embodiment 2. As illustrated in FIG. 15, this decompressing unit 300b includes a file reading unit 401, an automaton generating unit 402, a decompression processing unit 404, and a file writing unit 405. Furthermore, the decompressing unit 300b includes a first automaton 403a, a second automaton 403b, a third automaton 403c, and a fourth automaton 403d, for example.

The file reading unit 401 is a processing unit that reads out codes stored in the encoded data part 2b of the encoded file F5. The file reading unit 401 outputs the read-out codes to the decompression processing unit 404. Furthermore, the file reading unit 401 reads out information on the appearance frequency of the word stored in the header part 2a and outputs the information to the automaton generating unit 402. The file reading unit 401 reads out the dynamic dictionary information 304 stored in the trailer part 2c and outputs the dynamic dictionary information 304 to the automaton generating unit 402.

The automaton generating unit 402 generates the first automaton 403a that converts a static code to a word based on the information on the appearance frequency of the word. Furthermore, the automaton generating unit 402 generates the second automaton 403b to the fourth automaton 403d that convert a dynamic code to a word based on the dynamic dictionary information 304.

The first automaton 403a is an automaton that associates a static code with a word (word of high frequency). For example, if the leading four bits of the code are included in "0h (0000) to 9h (1001)," the word is identified through comparison between the first automaton 403a and the code.

The second automaton 403b is an automaton that associates a dynamic code with a word (word of the column 20a). The second automaton 403b is generated corresponding to the dynamic dictionary 20 corresponding to the attribute information "word of the column 20a." For example, if the leading 16 bits of the code are included in "A000h to A0FFh," the word (word of the column 20a) is identified through comparison between the second automaton 403b and the code.

The third automaton 403c is an automaton that associates a dynamic code with a word (word of the column 21a). The third automaton 403c is generated corresponding to the dynamic dictionary 21 corresponding to the attribute information "word of the column 21a." For example, if the leading 16 bits of the code are included in "A100h to A1FFh," the word (word of the column 21a) is identified through comparison between the third automaton 403c and the code.

The fourth automaton 403d is an automaton that associates a dynamic code with a word (word of the column 22a). The fourth automaton 403d is generated corresponding to the dynamic dictionary 22 corresponding to the attribute information "word of the column 22a." For example, if the leading 16 bits of the code are included in "A200h to A2FFh," the word (word of the column 22a) is identified through comparison between the fourth automaton 403d and the code.

The decompression processing unit 404 is a processing unit that identifies a word corresponding to a code based on the code acquired from the file reading unit 401 and the first automaton 403a to the fourth automaton 403d. For example, if the leading four bits of the code are included in "0h (0000) to 9h (1001)," the decompression processing unit 404 identifies the word corresponding to the code through comparison between the first automaton 403a and the code.

If the leading 16 bits of the code are included in "A000h to A0FFh," the decompression processing unit 404 identifies the word (word of the column 20a) through comparison between the second automaton 403b and the code.

If the leading 16 bits of the code are included in "A100h to A1FFh," the decompression processing unit 404 identifies the word (word of the column 21a) through comparison between the third automaton 403c and the code.

If the leading 16 bits of the code are included in "A200h to A2FFh," the decompression processing unit 404 identifies the word (word of the column 22a) through comparison between the fourth automaton 403d and the code.

The decompression processing unit 404 sequentially identifies the words corresponding to codes by repeatedly executing the above-described processing for the codes read out from the file reading unit 401 and outputs the identified words to the file writing unit 405.

The file writing unit 405 is a processing unit that stores the decoded words acquired from the decompression processing unit 404 in the decompressed file F6.

Figure 16:
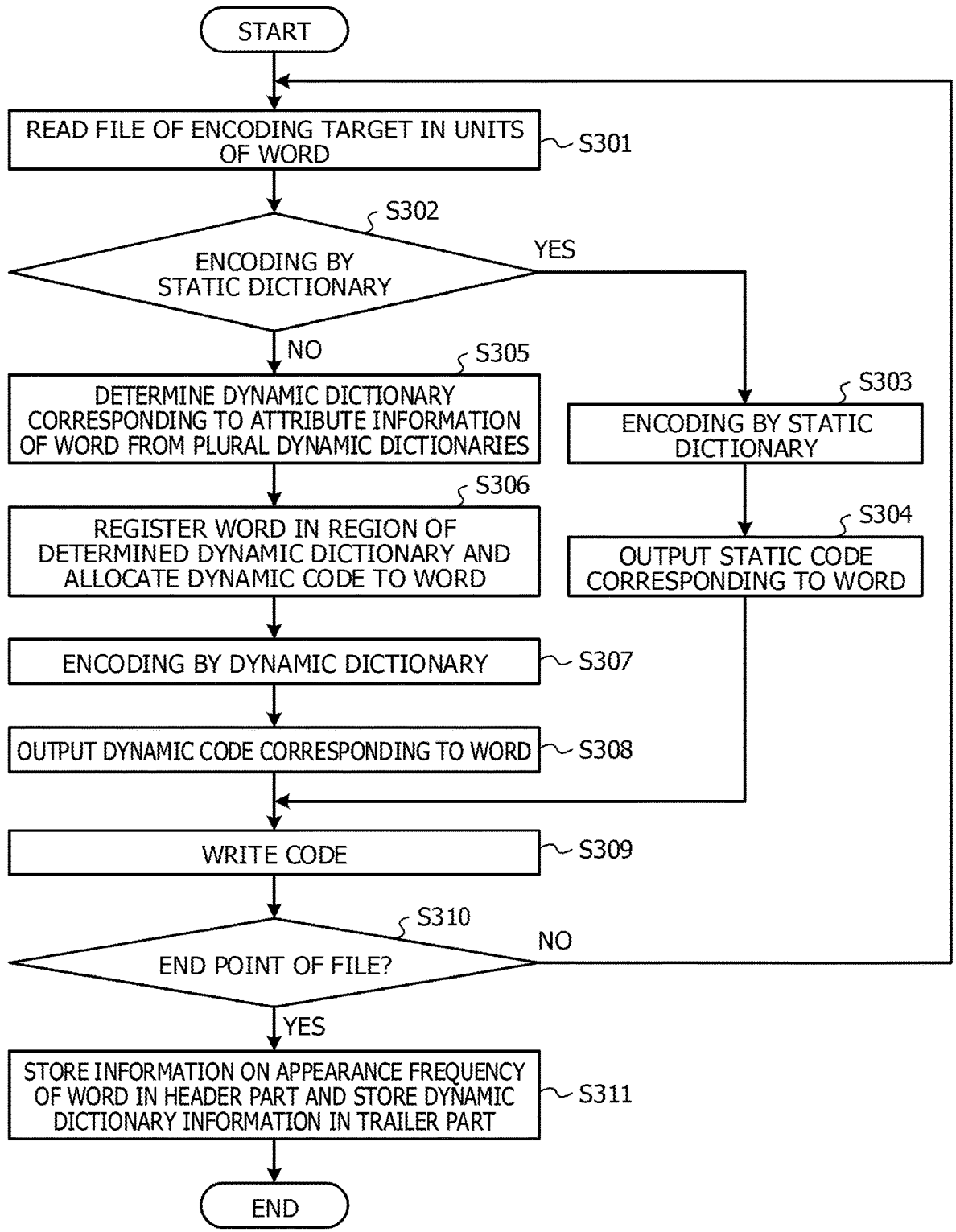
FIG. 16 is a flowchart illustrating processing procedure of the encoding unit according to the embodiment 2.

Next, processing procedure of the encoding unit 300a according to the present embodiment 2 will be described. FIG. 16 is a flowchart illustrating processing procedure of the encoding unit according to the present embodiment 2. As represented in FIG. 16, the file reading unit 301 of the encoding unit 300a reads the file F4 of an encoding target in units of word (step S301).

The static encoding unit 303 of the encoding unit 300a determines whether or not the word is a word of high frequency (step S302). For example, in the step S302, the static encoding unit 303 determines that the word is a word of high frequency if the word yields a hit in the static dictionary C2.

If the word is a word of high frequency (step S302, Yes), the static encoding unit 303 carries out encoding by the static dictionary C2 (step S303). The static encoding unit 303 outputs a static code corresponding to the word to the file writing unit 307 (step S304) and makes a transition to a step S309. On the other hand, if the word is not a word of high frequency (step S302, No), the static encoding unit 303 makes a transition to a step S305.

The dynamic encoding unit 306 of the encoding unit 300a determines the dynamic dictionary corresponding to the attribute information of the word from plural dynamic dictionaries based on the type table 305 (step S305). The dynamic encoding unit 306 registers the word in a region of the determined dynamic dictionary and allocates a dynamic code to the word (step S306). The dynamic encoding unit 306 carries out encoding by the dynamic dictionary (step S307) and outputs the dynamic code corresponding to the word to the file writing unit 307 (step S308).

The file writing unit 307 writes the code (static code or dynamic code) to the encoded data part 2b of the encoded file F5 (step S309). The encoding unit 300a determines whether or not the end point of the file F4 has been reached (step S310). If the end point of the file F4 has not been reached (step S310, No), the encoding unit 300a makes a transition to the step S301.

If the end point of the file F4 has been reached (step S310, Yes), the file writing unit 307 stores information on the appearance frequency of the word in the header part 2a of the encoded file F5 and stores the dynamic dictionary information 304 in the trailer part 2c (step S311).

Figure 17:
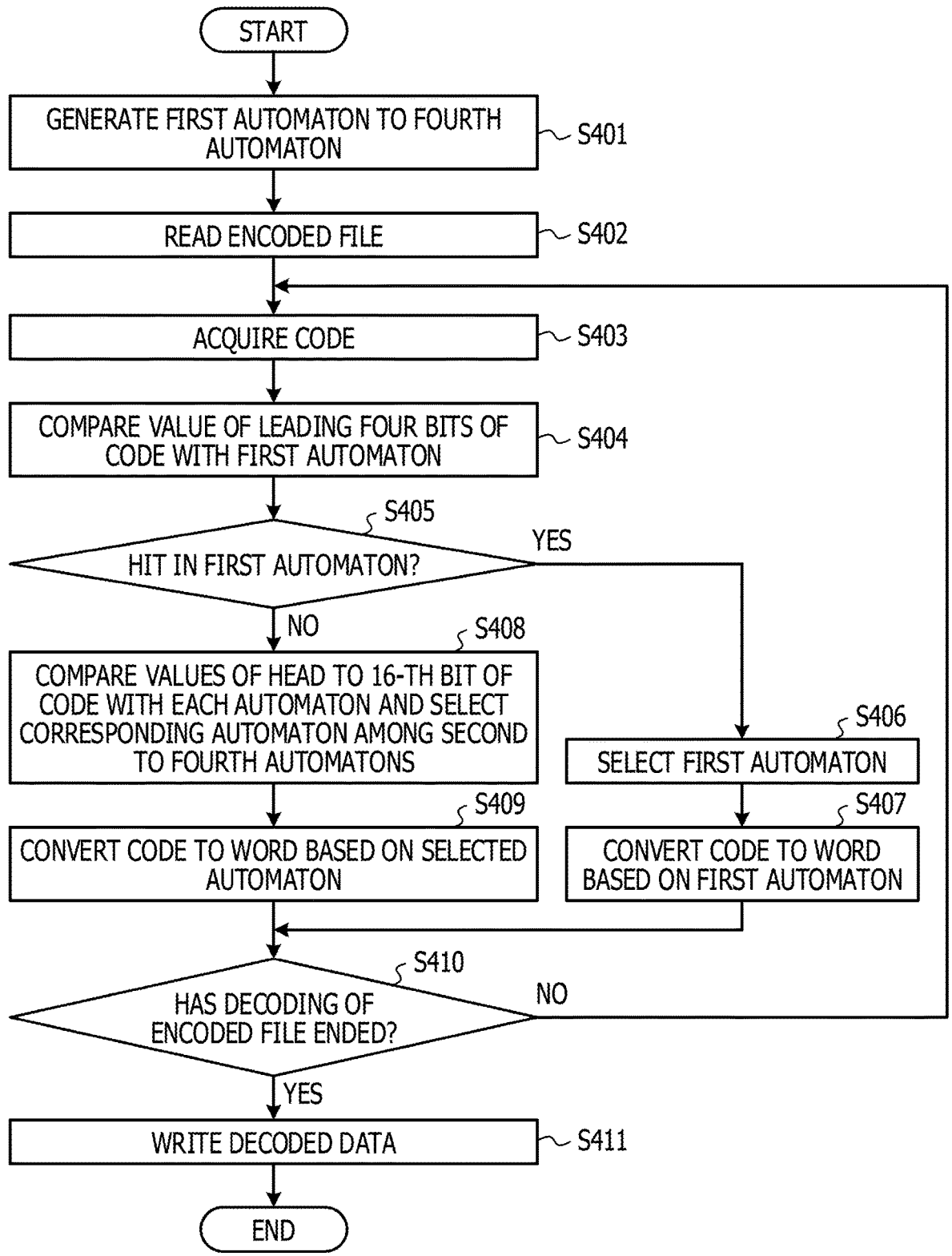
FIG. 17 is a flowchart illustrating processing procedure of the decompressing unit according to the embodiment 2.

Next, processing procedure of the decompressing unit 300b according to the present embodiment 2 will be described. FIG. 17 is a flowchart illustrating processing procedure of the decompressing unit according to the present embodiment 2. As represented in FIG. 17, the automaton generating unit 202 of the decompressing unit 300b generates the first automaton 403a to the fourth automaton 403d (step S401). The file reading unit 401 reads the encoded file F5 (step S402).

The decompression processing unit 404 of the decompressing unit 300b acquires a code (step S403) and compares the value of the leading four bits of the code with the first automaton 403a (step S404). If a hit in the first automaton 403a is obtained (step S405, Yes), the decompression processing unit 404 selects the first automaton 403a (step S406). The decompression processing unit 404 converts the code to a word (step S407) based on the first automaton 403a and makes a transition to a step S410.

On the other hand, if a hit in the first automaton 403a is not obtained (step S405, No), the decompression processing unit 404 makes a transition to a step S408. The decompression processing unit 404 compares the values of the head to the 16-th bit of the code with each automaton and selects the corresponding automaton among the second to fourth automatons 403b to 403d (step S408).

The decompression processing unit 404 converts the code to a word based on the selected automaton (step S409). The decompression processing unit 404 determines whether or not the decoding of the encoded file F5 has ended (step S410). If the decoding of the encoded file F5 has not ended (step S410, No), the decompression processing unit 404 makes a transition to the step S403.

If the decoding of the encoded file F5 has ended (step S410, Yes), the decompression processing unit 404 writes the decoded data to the decompressed file F6 (step S411).

Next, effects of the encoding unit 300a according to the present embodiment 2 will be described. The encoding unit 300a determines the dynamic dictionary corresponding to the attribute information (column in which the word is included) of the word included in the file F4 and carries out dynamic encoding by using the determined dynamic dictionary. This allows the dynamic dictionary in which words are associated with dynamic codes to be discriminated based on the attribute information of the word and thus the dynamic dictionary may be efficiently used. For example, based on the attribute information of the word, words corresponding to dynamic codes are registered in the respective dynamic dictionaries with discrimination. Thus, in the case of carrying out decoding, the decoding may be carried out by using the automaton corresponding to the relevant dynamic dictionary.

Furthermore, although the encoding unit 300a according to the present embodiment 2 uses the column of the word as the encoding target as the attribute information and determines the dynamic dictionary corresponding to the attribute information, the configuration is not limited thereto. For example, in the case of encoding text data having a hierarchical structure, the encoding unit 300a may use the position of the hierarchical level to which the word belongs as the attribute information.

For example, description will be made about one example of processing of the encoding unit 300a when text data having first to third hierarchical levels is encoded. In the case of carrying out dynamic encoding of a word that belongs to the first hierarchical level, the encoding unit 300a registers the word in the dynamic dictionary 20 and allocates a dynamic code to the word. In the case of carrying out dynamic encoding of a word that belongs to the second hierarchical level, the encoding unit 300a registers the word in the dynamic dictionary 21 and allocates a dynamic code to the word. In the case of carrying out dynamic encoding of a word that belongs to the third hierarchical level, the encoding unit 300a registers the word in the dynamic dictionary 22 and allocates a dynamic code to the word.

As described above, the encoding unit 300a determines the dynamic dictionary corresponding to the attribute information (hierarchical level at which the word is located) of the word included in text data having a hierarchical structure and carries out dynamic encoding by using the determined dynamic dictionary. This allows the dynamic dictionary in which words are associated with dynamic codes to be discriminated based on the attribute information of the word and thus the dynamic dictionary may be efficiently used.

Incidentally, the above-described encoding unit 100a (300a) may reduce the amount of data stored in the buffer D3 by executing processing to be described below in the case of carrying out dynamic encoding of words.

Figure 18:
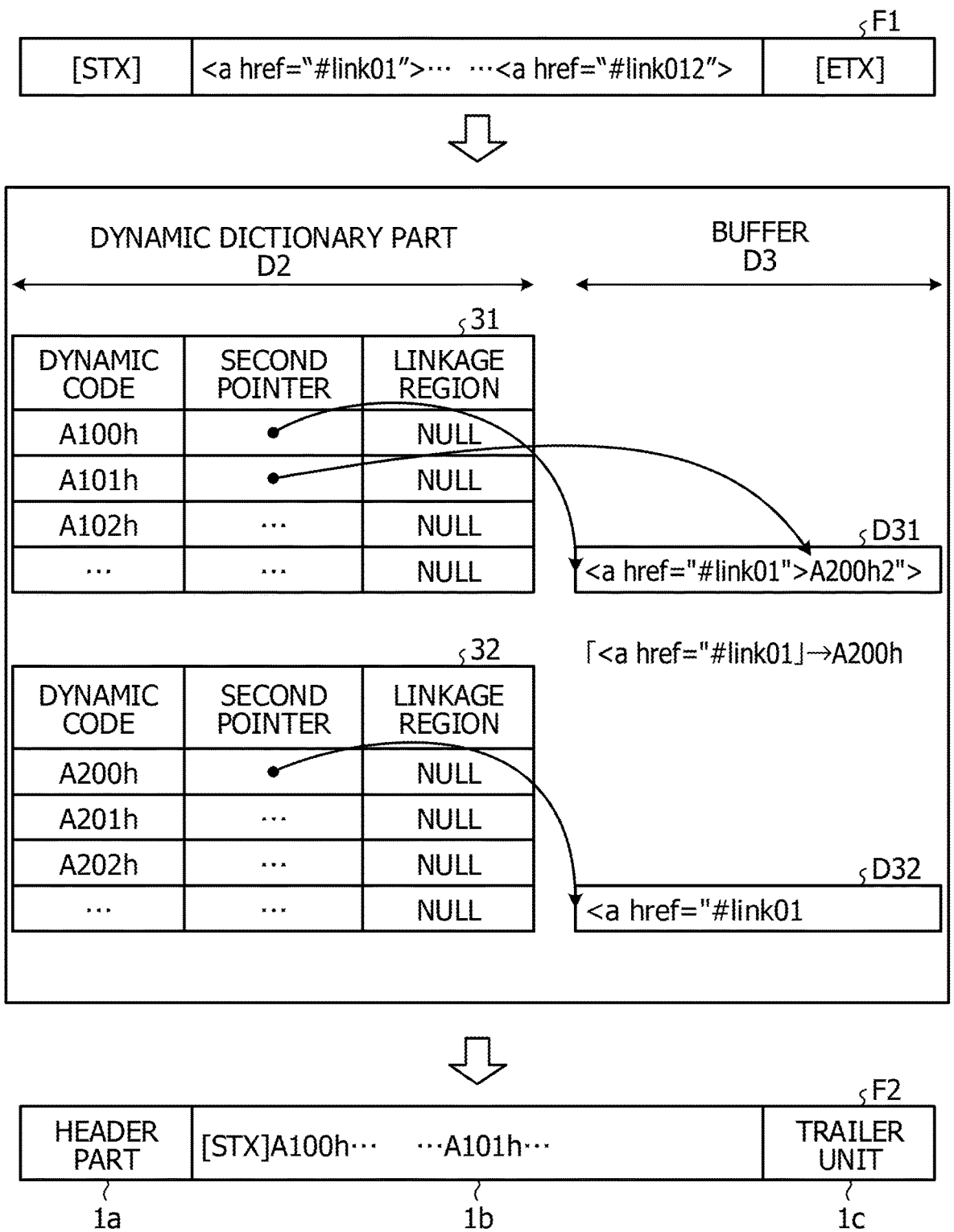
FIG. 18 is a diagram for explaining another kind of processing of an encoding unit.

FIG. 18 is a diagram for explaining another kind of processing of an encoding unit. In the example illustrated in FIG. 18, the encoding unit 100a reads out the text file F1 of an encoding target and generates the encoded file F2 by carrying out static encoding by a static dictionary and dynamic encoding by a dynamic dictionary. Here, in the case of carrying out dynamic encoding, the encoding unit 100a reduces the amount of data by searching each word stored in the buffer D3 for the longest matching character string and allocating a dynamic code to the longest matching character string.

Regarding the example explained with FIG. 18, explanation will be made by using a dynamic dictionary 31 and a dynamic dictionary 32. The dynamic dictionary 31 is a dynamic dictionary used when a word of attribute information "tag" is subjected to dynamic encoding. The dynamic dictionary 32 is a dynamic dictionary used when the "longest matching character string" is subjected to dynamic encoding.

The encoding unit 100a reads out a word "<a href="#link01">" from the text file F1 and selects the dynamic dictionary 31 corresponding to the attribute information "tag" of the word. The encoding unit 100a allocates a dynamic code "A100h" and stores the word "<a href="#link01">" in a buffer D31. The encoding unit 100a sets the second pointer corresponding to the dynamic code "A100h" at the beginning position of "<a href="#link01">" stored in the buffer D31. The encoding unit 100a stores the dynamic code "A100h" in the encoded data part 1b of the encoded file F2.

The encoding unit 100a reads out the word "<a href="#link012">" from the text file F1 and selects the dynamic dictionary 31 corresponding to the attribute information "tag" of the word. The encoding unit 100a allocates a dynamic code "A101h" and stores the word "<a href="#link012">" in the buffer D31. The encoding unit 100a sets the second pointer corresponding to the dynamic code "A101h" at the beginning position of "<a href="#link012">" stored in the buffer D31. The encoding unit 100a stores the dynamic code "A101h" in the encoded data part 1b of the encoded file F2.

Subsequently, the encoding unit 100a searches for the longest matching character string about a character string "<a href="#link01"><a href="#link012">" stored in the buffer D31. In this case, "<a href="#link01"" is the longest matching character string.

The encoding unit 100a allocates a dynamic code to the longest matching character string "<a href="#link01"" by using the dynamic dictionary 32. For example, the encoding unit 100a allocates a dynamic code "A200h" to the longest matching character string "<a href="#link01"." The encoding unit 100a updates the character string stored in the buffer D31 to "<a href="#link01">A200h2">" by using the dynamic code. For example, the encoding unit 100a converts, to a dynamic code, the second or subsequent longest matching character string among the same longest matching character strings included in the character string registered in the buffer D31.

The encoding unit 100a stores the longest matching character string "<a href="#link01"" in a buffer D32 and sets the second pointer corresponding to the dynamic code "A200h" at the beginning position of "<a href="#link01"" stored in the buffer D32.

As described above, in the case of carrying out dynamic encoding, the encoding unit 100a may reduce the amount of data by searching each word stored in the buffer D31 for the longest matching character string and allocating a dynamic code to the longest matching character string.

Figure 19:
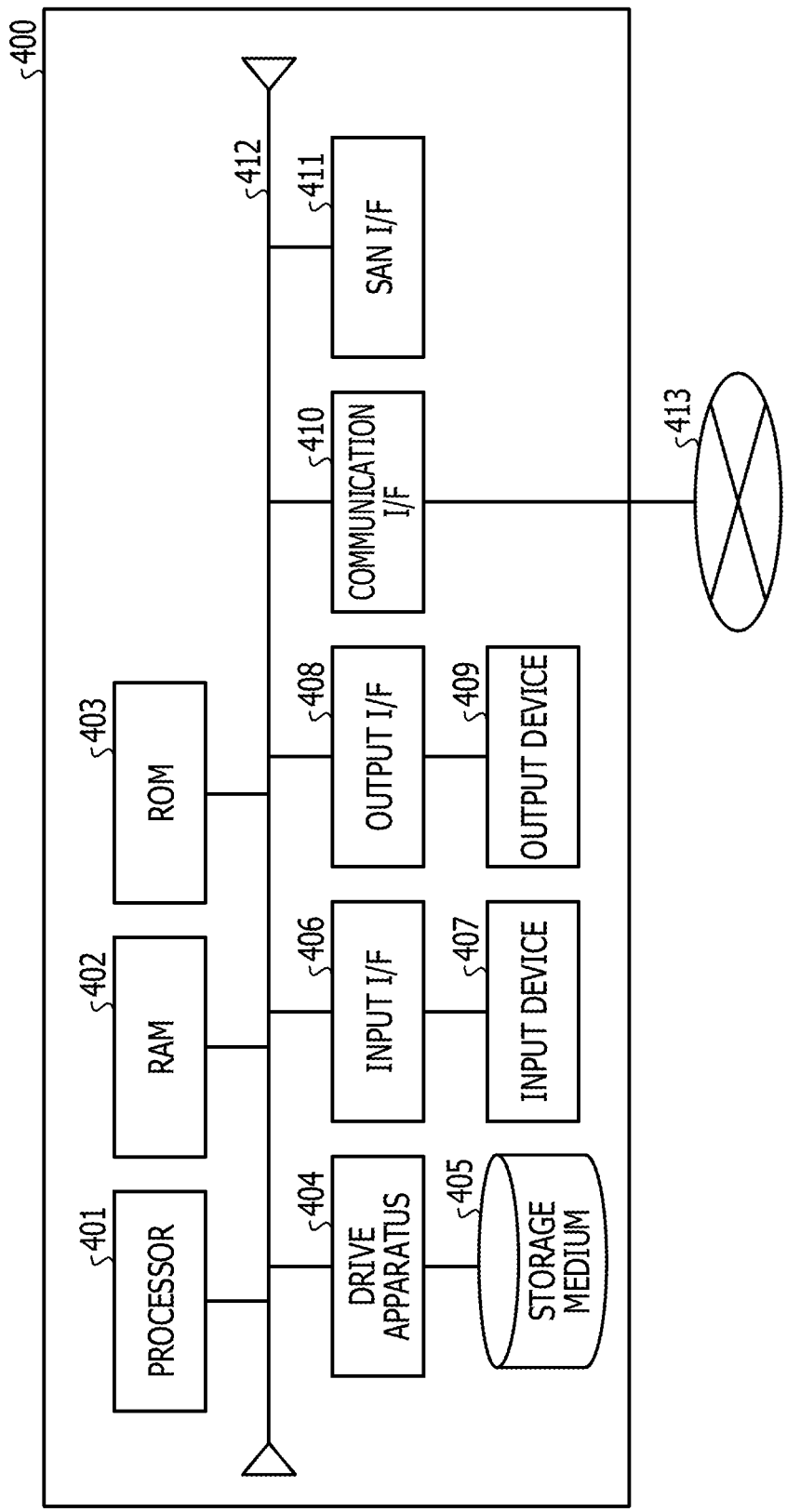
FIG. 19 is a diagram illustrating a hardware configuration example of a computer.

Hardware and software used for the present embodiments will be described below. FIG. 19 is a diagram illustrating a hardware configuration example of a computer. A computer 400 includes a processor 401, a RAM 402, a ROM 403, drive apparatus 404, a storage medium 405, an input interface (I/F) 406, an input device 407, an output I/F 408, an output device 409, a communication I/F 410, a storage area network (SAN) I/F 411, and a bus 412, for example. The respective pieces of hardware are coupled through the bus 412.

The RAM 402 is readable-writable memory apparatus and a semiconductor memory such as a static RAM (SRAM) or a dynamic RAM (DRAM) is used. Alternatively, a flash memory or the like is used instead of the RAM. The ROM 403 also includes a programmable ROM (PROM) and so forth. The drive apparatus 404 is apparatus that carries out at least either one of reading and writing of information recorded in the storage medium 405. The storage medium 405 stores information written by the drive apparatus 404. The storage medium 405 is a hard disk, a flash memory such as a solid state drive (SSD), or a storage medium such as a compact disc (CD), digital versatile disc (DVD), or Blu-ray Disc, for example. Furthermore, the computer 400 is provided with the drive apparatus 404 and the storage medium 405 regarding each of plural kinds of storage media, for example.

The input interface 406 is a circuit that is coupled to the input device 407 and transmits an input signal received from the input device 407 to the processor 401. The output interface 408 is a circuit that is coupled to the output device 409 and causes the output device 409 to carry out output according to an instruction by the processor 401. The communication interface 410 is a circuit that carries out control of communication through a network 413. The communication interface 410 is a network interface card (NIC), for example. The SAN interface 411 is a circuit that carries out control of communication with storing apparatus coupled to the computer 400 by a storage area network. The SAN interface 411 is a host bus adapter (HBA), for example.

The input device 407 is apparatus that transmits an input signal according to operation. The input device 407 is key apparatus such as a keyboard and buttons attached to the main body of the computer 400 and pointing devices such as mouse and touch panel. The output device 409 is apparatus that outputs information according to control by the computer 400. The output device 409 is image output apparatus (display device) such as a display and sound output apparatus such as a speaker. Furthermore, input-output apparatus such as a touch screen is used as the input device 407 and the output device 409. Moreover, the input device 407 and the output device 409 may be integrated with the computer 400 or may be pieces of apparatus that are not included in the computer 400 and that are coupled to the computer 400 from the external, for example.

For example, the processor 401 reads out a program stored in the ROM 403 or the storage medium 405 into the RAM 402 and executes processing of the encoding unit 100a (300a) or processing of the decompressing unit 100b (300b) in accordance with the procedure of the read-out program. At this time, the RAM 402 is used as a work area for the processor 401. Functions of the storing unit 100c are implemented through storing of program files (application program 54, middleware 53, and operating system (OS) 52 to be described later and so forth) and data files (file F1 of a compression target, compressed encoded file F2, and so forth) by the ROM 403 and the storage medium 405 and the use of the RAM 402 as the work area for the processor 401. The programs read out by the processor 401 will be described by using FIG. 20.

Figure 20:
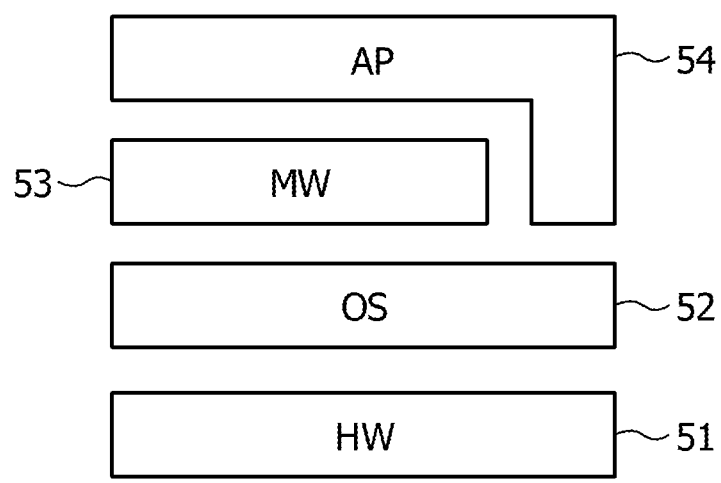
FIG. 20 is a diagram illustrating a configuration example of programs that operate on a computer.

FIG. 20 illustrates a configuration example of programs that operate on a computer. In the computer 400, the OS 52 that controls a hardware group 51 (401 to 411) illustrated in FIG. 19 operates. The processor 401 operates in procedure in accordance with the OS 52 and control and management of the hardware group 51 are carried out. Thereby, processing in accordance with the application program 54 or the middleware 53 is executed in the hardware group 51. Moreover, in the computer 400, the middleware 53 or the application program 54 is read out by the RAM 402 to be executed by the processor 401.

When an encoding processing function is called, the processor 401 executes processing based on at least part of the middleware 53 or the application program 54 (controls the hardware group 51 based on the OS 52 for the processing). Thereby, functions of the encoding unit 100a (300a) are implemented. Furthermore, when a decompression function is called, the processor 401 executes processing based on at least part of the middleware 53 or the application program 54 (controls the hardware group 51 based on the OS 52 for the processing). Thereby, functions of the decompressing unit 100b (300b) are implemented. The encoding processing function and the decompression function may be each included in the application program 54 itself or may be part of the middleware 53 executed through being called in accordance with the application program 54.

Figure 21:
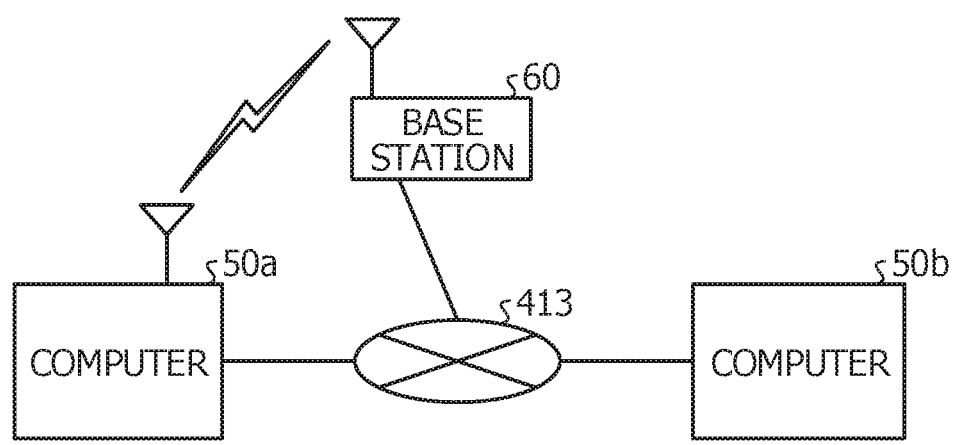
FIG. 21 is a diagram illustrating a configuration example of pieces of apparatus in a system of an embodiment.

FIG. 21 is a diagram illustrating a configuration example of pieces of apparatus in a system of an embodiment. The system of FIG. 21 includes a computer 50a, a computer 50b, a base station 60, and the network 413. The computer 50a is coupled to the network 413 coupled to the computer 50b based on at least either a wireless system or a wired system.

The encoding unit 100a and the decompressing unit 100b illustrated in FIG. 2 may be included in either the computer 50a or the computer 50b illustrated in FIG. 21. The computer 50b may include the encoding unit 100a and the computer 50a may include the decompressing unit 100b. Alternatively, the computer 50a may include the encoding unit 100a and the computer 50b may include the decompressing unit 100b. Furthermore, both the computer 50a and the computer 50b may include the encoding unit 100a and the decompressing unit 100b.

Part of modification examples in the above-described embodiments will be described below. In addition to modification examples to be described below, design changes within such a range as not to depart from the spirit of the present disclosure may be made as appropriate. The target of the encoding processing may be a monitoring message or the like output from a system besides data in a file. For example, processing of encoding monitoring messages sequentially stored in a buffer by the above-described encoding processing and storing the monitoring messages as log files, or the like, is executed. Furthermore, for example, encoding may be carried out in units of page in a database or encoding may be carried out in units of plural pages collectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An encoding apparatus comprising:
   a memory; and
   a processor coupled to the memory and the processor configured to:
   acquire text data, the text data including a plurality of words, each word corresponding to a word type, the word type including a word attribute information, the word attribute information being based on a word position information, the word position information indicating a position of the word within the text data,
   determine that a first word included in the plurality of words of the text data is to be encoded by a dynamic dictionary, the first word including first attribute information, the first attribute information based on a first position information,
   determine a dynamic dictionary among a plurality of dynamic dictionaries for encoding the first word, by comparing a type information in which a specific attribute information and a position of a specific dynamic dictionary corresponding to the specific attribute information are associated with each other with the first attribute information of the first word included in the text data, the position of a specific dynamic dictionary indicating at least one area of 256 dynamic codes allocated to each of the plurality of dynamic dictionaries, the comparing uses a type table that associates the attribute information with a pointer that indicates the specific dynamic dictionary corresponding to the attribute information, the pointer indicating the position of a first dynamic dictionary when the attribute information is a low frequency word, indicating the position of a second dynamic dictionary when the attribute information is an unknown word, indicating the position of a third dynamic dictionary when the attribute information is a numerical value, and indicating the position of a fourth dynamic dictionary when the attribute information is a tag, wherein each dynamic dictionary includes 256 dynamic codes, wherein each dynamic dictionary of the plurality of dynamic dictionaries corresponds to a word attribute information, wherein the word attribute information of the first dynamic dictionary matches the first attribute information of the first word, wherein the first word is associated with a first dynamic code of the first dynamic dictionaries, wherein the first word partially matches a word registered in the plurality of dynamic dictionaries, register the first word in association with the first dynamic code among the 256 dynamic codes in the first dynamic dictionary, and encode the first word into the first dynamic code.

2. The encoding apparatus according to claim 1, the processor further configured to:

determine whether or not a second word included in the text data is included in a static dictionary, and encode the second word into a first static code associated with the second word in the static dictionary when the second word is included in the static dictionary.

3. The encoding apparatus according to claim 2, wherein the first word is not included in the static dictionary.

4. The encoding apparatus according to claim 1, the processor further configured to:

specify a fifth dynamic dictionary among the plurality of dynamic dictionaries based on first attribute information of a third word included in the text data, determine whether or not the third word is included in the fifth dynamic dictionary, and encode the third word into a second dynamic code associated with the third word in the fifth dynamic dictionary when the third word is included in the fifth dynamic dictionary.

5. The encoding apparatus according to claim 1, wherein the text data is a document having a hierarchical structure and the position information indicates a position in the hierarchical structure.

6. The encoding apparatus according to claim 1, wherein the text data is segmented into a plurality of columns by delimiters and the position information indicates a column in which the first word is located among the plurality of columns.

7. An encoding method executed by a computer, the encoding method comprising:

acquiring text data, the text data including a plurality of words, each word corresponding to a word type, the word type including a word attribute information, the word attribute information being based on a word position information, the word position information indicating a position of the word within the text data;

determine that a first word included in the plurality of words of the text data is to be encoded by a dynamic dictionary, the first word including first attribute information, the first attribute information based on a first position information;

determine a dynamic dictionary among a plurality of dynamic dictionaries for encoding the first word, by comparing a type information in which a specific attribute information and an address of a specific dynamic dictionary corresponding to the specific attribute information are associated with each other with the first attribute information of the first word included in the text data, the position of a specific dynamic dictionary indicating at least one area of 256 dynamic codes allocated to each of the plurality of dynamic dictionaries, the comparing uses a type table that associates the attribute information with a pointer that indicates the specific dynamic dictionary corresponding to the attribute information, the pointer indicating the position of a first dynamic dictionary when the attribute information is a low frequency word, indicating the position of a second dynamic dictionary when the attribute information is an unknown word, indicating the position of a third dynamic dictionary when the attribute information is a numerical value, and indicating the position of a fourth dynamic dictionary when the attribute information is a taq;

register the first word in association with the first dynamic code among the 256 dynamic codes in the first dynamic dictionary; and encode the first word into the first dynamic code, wherein each dynamic dictionary includes 256 dynamic codes, each dynamic dictionary of the plurality of dynamic dictionaries corresponds to a word attribute information, the word attribute information of the first dynamic dictionary matches the first attribute information of the first word, the first word is associated with a first dynamic code of the first dynamic dictionaries, and the first word partially matches a word registered in the plurality of dynamic dictionaries.

8. The encoding method according to claim 7, further comprising:

determining whether or not a second word included in the text data is included in a static dictionary; and encoding the second word into a first static code associated with the second word in the static dictionary when the second word is included in the static dictionary.

9. The encoding method according to claim 8, wherein the first word is not included in the static dictionary.

10. The encoding method according to claim 7, further comprising:

specifying a fifth dynamic dictionary among the plurality of dynamic dictionaries based on attribute information of a third word included in the text data;

determining whether or not the third word is included in the fifth dynamic dictionary; and encoding the third word into a second dynamic code associated with the third word in the fifth dynamic dictionary when the third word is included in the fifth dynamic dictionary.

11. The encoding method according to claim 7, wherein the text data is a document having a hierarchical structure and the position information indicates a position in the hierarchical structure.

12. The encoding method according to claim 7, wherein the text data is segmented into a plurality of columns by delimiters and the position information indicates a column in which the first word is located among the plurality of columns.

13. A non-transitory computer-readable medium storing an encoding program that causes a computer to execute a process comprising:

acquiring text data, the text data including a plurality of words, each word corresponding to a word type, the word type including a word attribute information, the word attribute information being based on a word position information, the word position information indicating a position of the word within the text data;

determine that a first word included in the plurality of words of the text data is to be encoded by a dynamic dictionary, the first word including first attribute information, the first attribute information based on a first position information;

determine a first dynamic dictionary among a plurality of dynamic dictionaries for encoding the first word, by comparing a type information in which a specific attribute information and an address of a specific dynamic dictionary corresponding to the specific attribute information are associated with each other with the first attribute information of the first word included in the text data, the position of a specific dynamic dictionary indicating at least one area of 256 dynamic codes allocated to each of the plurality of dynamic dictionaries, the comparing uses a type table that associates the attribute information with a pointer that indicates the specific dynamic dictionary corresponding to the attribute information, the pointer indicating the position of a first dynamic dictionary when the attribute information is a low frequency word, indicating the position of a second dynamic dictionary when the attribute information is an unknown word, indicating the position of a third dynamic dictionary when the attribute information is a numerical value, and indicating the position of a fourth dynamic dictionary when the attribute information is a tag;

register the first word in association with the first dynamic code among the 256 dynamic codes in the first dynamic dictionary; and encode the first word into the first dynamic code, wherein each dynamic dictionary includes 256 dynamic codes, each dynamic dictionary of the plurality of dynamic dictionaries corresponds to a word attribute information, the word attribute information of the first dynamic dictionary matches the first attribute information of the first word, the first word is associated with a first dynamic code of the first dynamic dictionaries, and the first word partially matches a word registered in the plurality of dynamic dictionaries.

* * * * *